US012572716B2

(12) United States Patent
Gandy et al.

(10) Patent No.: US 12,572,716 B2
(45) Date of Patent: Mar. 10, 2026

(54) PREDICTIVE AGRICULTURAL SYSTEM AND DYNAMIC MODELING TOOL

(71) Applicant: INARI AGRICULTURE TECHNOLOGY, INC., Cambridge, MA (US)

(72) Inventors: Anya Gandy, Cambridge, MA (US); Nicole Neville, Cambridge, MA (US); Howard W. Buffett, Cambridge, MA (US)

(73) Assignee: INARI AGRICULTURE TECHNOLOGY, INC., Cambridge, MA (US)

( * ) Notice: Subject to any disclaimer, the term of this patent is extended or adjusted under 35 U.S.C. 154(b) by 0 days.

(21) Appl. No.: 18/770,338

(22) Filed: Jul. 11, 2024

(65) Prior Publication Data

US 2025/0021722 A1     Jan. 16, 2025

Related U.S. Application Data

(60) Provisional application No. 63/513,650, filed on Jul. 14, 2023.

(51) Int. Cl.
G06F 30/20 (2020.01)
(52) U.S. Cl.
CPC .................................... *G06F 30/20* (2020.01)
(58) Field of Classification Search
None
See application file for complete search history.

(56) References Cited

U.S. PATENT DOCUMENTS

2005/0222834 A1* 10/2005 Riley ..................... G16H 50/50
703/22
2014/0358486 A1* 12/2014 Osborne .................. A01G 7/00
702/189

(Continued)

FOREIGN PATENT DOCUMENTS

WO      WO-2021232407 A1 * 11/2021

OTHER PUBLICATIONS

Jia et al., Spraying Control Method and Apparatus, Nov. 2021, Chinese Patent Office, pp. 1-28 (Year: 2021).*

(Continued)

*Primary Examiner* — Ryan F Pitaro
*Assistant Examiner* — Bernard E Cothran
(74) *Attorney, Agent, or Firm* — McKee, Voorhees & Sease, PLC

(57) ABSTRACT

A system is used to perform systems modeling related to at least agriculture. The system can include a memory unit that stores executable instructions wherein the instructions can be used to perform systems modeling. The system can obtain, store, and use historical data related to agricultural scenarios. The system can further generate and/or display a human machine interface wherein a user can enter input to tailor the input data based on the preferences and/or assumptions of the user. The system is further configured to perform a simulation based on the user-defined input data. The system can then provide and/or display the results of the simulation as output data The output data can include predicted and/or projected outcomes based on the input data wherein said outcomes can include agricultural information, market information, environmental information, and/or farm management information. The disclosure allows for accurate modeling of complex systems.

28 Claims, 16 Drawing Sheets

(56) References Cited

U.S. PATENT DOCUMENTS

| | | | |
|---|---|---|---|
| 2015/0242970 A1* | 8/2015 | Avey .................... | G06Q 50/163 705/314 |
| 2016/0215994 A1* | 7/2016 | Mewes ................ | G05B 13/048 |
| 2019/0050948 A1* | 2/2019 | Perry ..................... | A01B 79/02 |
| 2021/0144107 A1* | 5/2021 | Liang ....................... | G06N 5/04 |

OTHER PUBLICATIONS

United Sates Department of Agriculture (USDA), Livestock Mandatory Reporting(LMR) Dashboard Users Guide, May 2012, USDA, pp. 1-17 (Year: 2012).*

Seko et al., Economic modelling and simulation analysis of maize-based smallholder farming systems in the Senqu River Valley agroecological zone, Lesotho, 2022, Cogent Food & Agriculture, pp. 1-19 (Year: 2022).*

Bush et al., "Using System Dynamics to Model the Transition to Biofuels in the United States," National Renewable Energy Laboratory, Jun. 2008, 9 pages.

En-Roads, "En-Roads Enhanced with New Methane Capabilities," Climate Interactive, May 14, 2024. Retrieved from the Internet: <URL: climateinteractive.org/blog/may-2024-major-updates-to-en-roads/>, 1 page.

En-Roads, "En-Roads Technical Reference," Climate Interactive, Updated May 2024, 79 pages.

En-Roads, "En-Roads User Guide," Climate Interactive, Updated May 2024, 123 pages.

En-Roads, "The En-Roads Climate Solutions Simulator," Climate Interactive, 2024. Retrieved from the Internet: <URL: climateinteractive.org/en-roads/>, 9 pages.

En-Roads, Scenario Datasheet [online], Climate Interactive, 2024. Retrieved from the Internet: <URL: en-roads.climateinteractive.org/scenario.html?v=24.6.0/>, 1 page.

SDS, "Energy Consumer Industries Look for Alternatives Under Climate Policy Regulations," System Dynamics Society, Nov. 5, 2020. Retrieved from the Internet: <URL: systemdynamics.org/climate-change-and-energy/>, 1 page.

SDS, "How to Understand Climate Change Policies with C-ROADS," System Dynamics Society, Nov. 4, 2020. Retrieved from the Internet: <URL: systemdynamics.org/c-roads/>, 6 pages.

SDS, "Kenya District Uses System Dynamics To Manage Water Resources," System Dynamics Society, Nov. 5, 2020. Retrieved from the Internet: <URL: systemdynamics.org/sustainable-water-management-in-laikipia-district-kenya/>, 1 page.

SDS, "Management Design for Planted Forests in Japan Using System Dynamics," System Dynamics Society, Jun. 20, 2024. Retrieved from the Internet: <URL: systemdynamics.org/management-design-for-planted-forests-in-japan-using-system-dynamics/>, 4 pages.

SDS, "Mauritius Government Takes Integrated Approach on Energy Policy," System Dynamics Society, Nov. 5, 2020. Retrieved from the Internet: <URL: systemdynamics.org/energy-policy-analysis-in-mauritius/>, 1 page.

SDS, "Successful Applications of System Dynamics | Real-World Examples & Case Studies," Part 1, System Dynamics Society, 2024. Retrieved from the Internet: <URL: systemdynamics.org/resources/successful-applications/>, 13 pages.

SDS, "Successful Applications of System Dynamics | Real-World Examples & Case Studies," Part 2, System Dynamics Society, 2024. Retrieved from the Internet: <URL: systemdynamics.org/resources/successful-applications/>, 7 pages.

SDS, "System Dynamics Breaks Dealer Hording and Stabilizes Seed Market," System Dynamics Society, Nov. 3, 2020. Retrieved from the Internet: <URL: systemdynamics.org/dealer-hoarding-sales-push-and-seed-returns/>, 1 page.

SDS, "System Dynamics Helps Farmers Escape Poverty Trap in Guatemala," System Dynamics Society, Apr. 11, 2023. Retrieved from the Internet: <URL: systemdynamics.org/system-dynamics-helps-farmers-escape-poverty-trap-in-guatemala/>, 4 pages.

* cited by examiner

/‑300

Legend

Future Scenarios Explored

------- Scenario 1: Historic Conditions Continuing (Market, Climate, etc.)

- - - - Scenario 2: a 6% One Time Increase in Soybean Market Demand in 2026

······· Scenario 3: 6% Demand Increase Plus Rapid Adoption of a 15% Higher-Yielding Soybean Plant with No Additional Fertilizer Needs ——— When the 6% Market Demand Increase Occurs

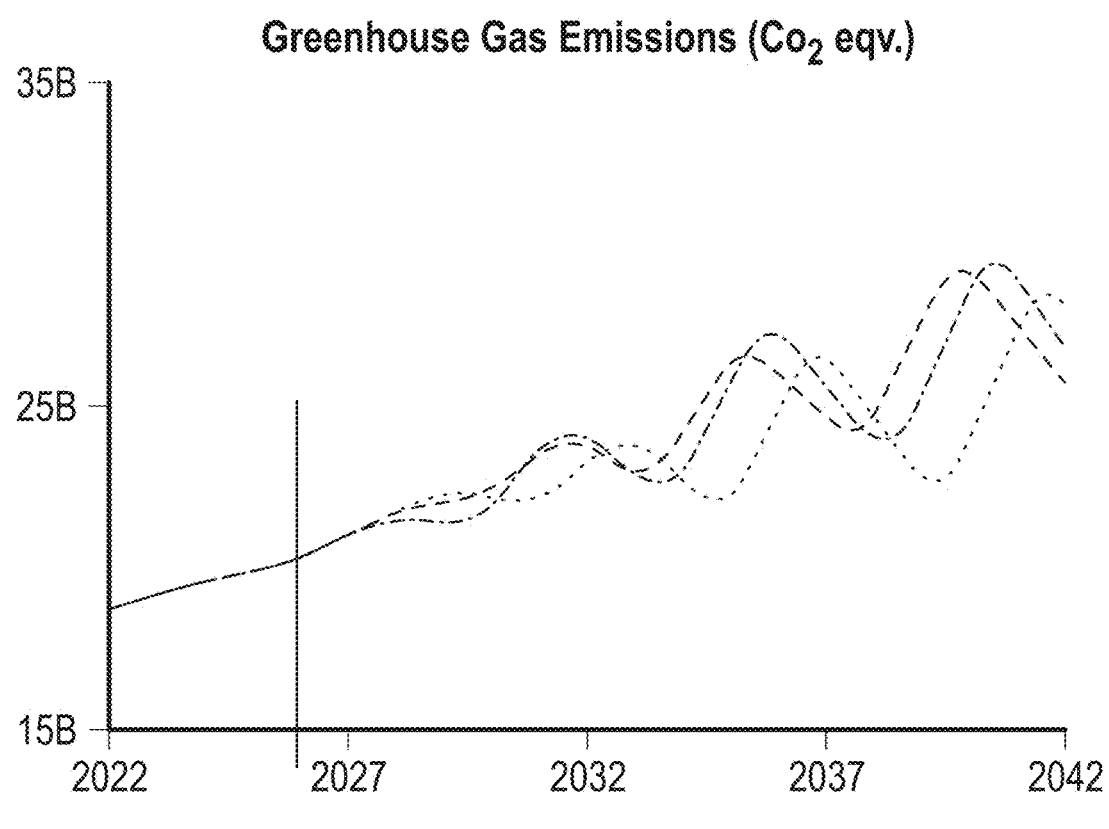

Greenhouse Gas Emissions (Co$_2$ eqv.)

FIG. 3B

PREDICTIVE AGRICULTURAL SYSTEM AND DYNAMIC MODELING TOOL

TECHNICAL FIELD

The present disclosure includes embodiments and/or aspects that relate generally to apparatus(es), system(s), and/or corresponding method(s) of use having applications in at least the agriculture, environmental, conservation, sustainability, and/or genetic plant editing industries. More particularly, but not exclusively, the present disclosure relates to apparatus(es), system(s), and/or corresponding method(s) that are configured to perform simulations and provide output data, using systems modeling based on user input.

BACKGROUND

The background description provided herein gives context for the present disclosure. Work of the presently named inventors, as well as aspects of the description that may not otherwise qualify as prior art at the time of filing, are neither expressly nor impliedly admitted as prior art.

As the world's population continues to grow, feeding said population is becoming increasingly important. Additionally, the ability to provide enough food for the world's population while also minimizing the agricultural industry's effect on the environment is paramount to creating a sustainable way of life.

Despite robust conservation efforts, the agricultural industry is one of the largest contributors to greenhouse gas emissions due to limitations with current technologies, practices, and commodity structures and incentives. Current conservation efforts lack the ability to perform dynamic systems modeling that considers a multitude of different factors and/or assumptions. Current conservation efforts further lack the ability to consider future events, trends, and/or occurrences, and, thus, lack the ability to prescribe future actions and/or practices. Modeling practices, such as Net Present Value (NPV), currently exist in the financial space to help forecast and plan for the future and to maximize future financial profits. However, no similar tool currently exists relating to agriculture and/or sustainability.

Thus, there exists a need in the art for an apparatus, system, and/or method which can efficiently and cost-effectively provide accurate modeling relating to the agriculture industry and/or relating to sustainability. There exists a further need in the art for such modeling to be able to consider a multitude of different factors and/or assumptions based on user input. There exists a further need in the art for such modeling to be able to predict and/or project future circumstances and prescribe future actions and/or practices.

SUMMARY

The following objects, features, advantages, aspects, and/or embodiments, are not exhaustive and do not limit the overall disclosure. No single embodiment need provide each and every object, feature, or advantage. Any of the objects, features, advantages, aspects, and/or embodiments disclosed herein can be integrated with one another, either in full or in part.

It is a primary object, feature, and/or advantage of any of the aspects of any of the embodiments of the present disclosure to improve on or overcome the deficiencies in the art.

It is a further object, feature, and/or advantage of any of the aspects of any of the embodiments of the present disclosure to provide a system, method, and/or apparatus to perform modeling related to agriculture and/or sustainability.

It is still yet a further object, feature, and/or advantage of any of the aspects of any of the embodiments of the present disclosure to apply discrete event modeling, agent-based modeling, system dynamics, and/or multi-method modeling.

It is still yet a further object, feature, and/or advantage of any of the aspects of any of the embodiments of the present disclosure to provide a dynamic systems model capable of considering many different inputs, which can be user-defined, and providing output data based on one or more simulations. The output data can prescribe future actions and/or practices. The output data can further allow the user to plan for the future.

It is still yet a further object, feature, and/or advantage of any of the aspects of any of the embodiments of the present disclosure to obtain and store historical data related to at least farm management practices, market conditions, and/or climate conditions.

It is still yet a further object, feature, and/or advantage of any of the aspects of any of the embodiments of the present disclosure to generate and/or display a human machine interface that is configured to display historical data.

It is still yet a further object, feature, and/or advantage of any of the aspects of any of the embodiments of the present disclosure to allow a user to modify and/or adjust historical data via a human machine interface.

It is still yet a further object, feature, and/or advantage of any of the aspects of any of the embodiments of the present disclosure to allow a user to create and/or apply future and/or projected data to be used in modeling related to a complex system.

It is still yet a further object, feature, and/or advantage of any of the aspects of any of the embodiments of the present disclosure to allow a user to provide input to a modeling framework.

It is still yet a further object, feature, and/or advantage of any of the aspects of any of the embodiments of the present disclosure to provide a human machine interface for a modeling framework that includes levers and/or adjusters wherein a user can provide input to the framework via the levers and/or adjusters.

It is still yet a further object, feature, and/or advantage of any of the aspects of any of the embodiments of the present disclosure to perform a simulation using at least one modeling framework based on user input.

It is still yet a further object, feature, and/or advantage of any of the aspects of any of the embodiments of the present disclosure to provide results of a simulation using dynamic systems modeling wherein the results allow a user to plan for the future and/or make decisions regarding future actions and/or practices.

The apparatus(es), system(s), and/or method(s) disclosed herein can be used in a wide variety of applications. For example, the apparatus(es), system(s), and/or methods can be applied to a variety of crops including, but not limited to, corn and soybeans. Further, apparatus(es), system(s), and/or methods(s) disclosed herein can consider a multitude of factors and/or assumptions when performing modeling and/or running simulations. Such factors can include market factors, climate factors, environmental factors, farming practices, and the like.

It is preferred the apparatus(es), system(s), and/or method(s) be safe, effective, cost-effective, efficient, and speedy. For example, the apparatus(es), system(s), and/or method(s) can receive, obtain, store, and/or apply large amounts of data spanning many years in a cost-effective and efficient manner. Additionally, the apparatus(es), system(s), and/or method(s) can consider a large number of variables, factors, assumptions, and/or preferences when performing simulations and/or conducting modeling and perform simulation(s) based on that input data in a cost-effective, efficient, and speedy manner. Further, apparatus(es), system(s), and/or method(s) can provide wide ranging output data based on simulation(s) in a cost-effective, efficient, and speedy manner.

At least one embodiment disclosed herein comprises a distinct aesthetic appearance. Ornamental aspects included in such an embodiment can help capture a consumer's attention and/or identify a source of origin of a product being sold. Said ornamental aspects will not impede functionality of the present disclosure.

The apparatus(es), system(s), and/or method(s) disclosed herein can be incorporated into larger designs and/or systems, which accomplish some or all of the previously stated objectives.

According to some aspects of the present disclosure, a computer-implemented method for systems modeling comprises generating a human machine interface to display default data; allowing a user to provide input, via the human machine interface, to adjust the default data and/or to provide additional information; performing at least one simulation based on the user input wherein performing the at least one simulation comprises applying a modeling framework; providing output information based on the at least one simulation.

According to at least some aspects of the present disclosure, the output information comprises at least one graph featuring aspects of the at least one simulation.

According to at least some aspects of the present disclosure, the output information comprises data related to company market share, crop production, acres planted, greenhouse gas emissions, water consumption, chemical runoff, economic metrics at a commodity market level, economic metrics at a farm level, price information, carbon cost and/or savings information, and/or irrigation information.

According to at least some aspects of the present disclosure, the output information comprises at least one graph, chart, and/or numerical value.

According to at least some aspects of the present disclosure, the user input comprises data regarding product type, market demand, climate conditions, and/or chemical application.

According to at least some aspects of the present disclosure, the method further comprises displaying the at least one simulation via the human machine interface.

According to at least some aspects of the present disclosure, the method further comprises allowing changes to be made to the user input to create new user input after performing the at least one simulation.

According to at least some aspects of the present disclosure, the method further comprises performing a second simulation based on the new user input.

According to at least some aspects of the present disclosure, the method further comprises providing and/or displaying new output information based on the second simulation in conjunction with the output information based on the at least one simulation.

According to at least some aspects of the present disclosure, the default data is based on historical data dating back to at least the year 2000.

According to at least some aspects of the present disclosure, the default data can be adjusted by the user via levers included as part of the human machine interface.

According to at least some aspects of the present disclosure, the modeling framework comprises use of discrete event modeling, agent-based modeling, system dynamics, and/or multi-method modeling.

According to at least some aspects of the present disclosure, a system to be used for systems modeling comprises a memory unit configured to store executable instructions; a processing unit operatively connected to the memory unit, wherein the processing unit is configured to execute the executable instructions; wherein the executable instructions comprise: storing historical data for use by the system as a historical baseline dataset; allowing a user to create a future baseline dataset by modifying the historical baseline dataset; allowing the user to provide input regarding additional factors not included as part of either the historical baseline dataset and/or the future baseline dataset; running at least one simulation based on the historical baseline dataset, the future baseline dataset, and/or the additional factors; displaying output data based on the at least one simulation.

According to at least some aspects of the present disclosure, the memory unit is a non-transitory computer-readable medium.

According to at least some aspects of the present disclosure, the system is configured to be used for agricultural purposes.

According to at least some aspects of the present disclosure, the executable instructions further comprise generating a human machine interface, wherein the user is able to create the future baseline dataset and provide the input regarding the additional factors via the human machine interface.

According to at least some aspects of the present disclosure, the step of displaying output data is performed via the human machine interface.

According to at least some aspects of the present disclosure, the human machine interface can be accessed via a computing tool such as a smart device, mobile phone, tablet, and/or computer.

According to at least some aspects of the present disclosure, the historical baseline dataset comprises data related to historical market conditions and/or historical climate conditions and the future baseline dataset comprises data related to future market conditions and/or future climate conditions.

According to at least some aspects of the present disclosure, the historical market conditions comprise historical data including pricing data, maximum product acres share percentage, first year product adoption percentage, annual growth percentage, base annual percentage demand growth, percentage ramp change in demand, and/or ramp year.

According to at least some aspects of the present disclosure, the future market conditions comprise data including pricing data, maximum product acres share percentage, first year product adoption percentage, annual growth percentage, base annual percentage demand growth, percentage ramp change in demand, and/or ramp year.

According to at least some aspects of the present disclosure, the historical climate conditions comprise historical data including drought data, water saturation data, rain events, and/or heat events.

According to at least some aspects of the present disclosure, the future climate conditions comprise future data including drought data, water saturation data, rain events, and/or heat events.

According to at least some aspects of the present disclosure, the additional factors comprise factors related to magnitude of crop yield improvement, product launch year, fertilizer consumption, pesticide consumption, soil carbon data, yield per acre, yield per acre increase, maximum bushel per acre data, nitrogen use efficiency, water use efficiency, grain percentage of biomass, pricing information, seeding rate, carbon impact, and/or yield increase percentage.

According to at least some aspects of the present disclosure, the output data comprises data related to company market share, crop production, acres planted, greenhouse gas emissions, water consumption, chemical runoff, economic metrics at a commodity market level, economic metrics at a farm level, price information, carbon cost and/or savings information, and/or irrigation information.

According to at least some aspects of the present disclosure, the output data can comprise at least one comparison between the historical baseline dataset and the future baseline dataset.

According to at least some aspects of the present disclosure, the instruction of running the at least one simulation comprises applying a modeling framework wherein the modeling framework comprises discrete event modeling, agent-based modeling, system dynamics, and/or multi-method modeling.

According to at least some aspects of the present disclosure, the modeling framework is developed using machine learning and/or artificial intelligence.

According to at least some aspects of the present disclosure, the system further comprises a database to store the historical data.

According to at least some aspects of the present disclosure, a non-transitory computer-readable medium comprising executable instructions that, when executed, perform operations, the operations comprises displaying historical baseline data via a human machine interface; allowing a user to create future baseline data, via the human machine interface, by modifying the historical baseline data; allowing the user to provide additional input via one or more levers included as part of the human machine interface; performing a simulation based on the historical baseline data, the future baseline data, and/or the additional user input provided via the one or more levers; displaying results of the simulation via the human machine interface.

According to at least some aspects of the present disclosure, the operations are performed via a processing unit.

According to at least some aspects of the present disclosure, the step of performing the simulation comprises applying discrete event modeling, agent-based modeling, system dynamics, and/or multi-method modeling.

According to at least some aspects of the present disclosure, a non-transitory computer-readable medium configured to store executable instructions, the executable instructions comprising one or more instructions that, when executed by a processing unit, cause the processing unit to: display historical baseline data via a human machine interface; allow a user to create future baseline data, via the human machine interface, by modifying the historical baseline data; allow the user to provide additional input via one or more levers included as part of the human machine interface; perform a simulation based on the historical baseline data, the future baseline data, and/or the additional user input provided via the one or more levers; display results of the simulation via the human machine interface.

These and/or other objects, features, advantages, aspects, and/or embodiments will become apparent to those skilled in the art after reviewing the following brief and detailed descriptions of the drawings. Furthermore, the present disclosure encompasses aspects and/or embodiments not expressly disclosed but which can be understood from a reading of the present disclosure, including at least: (a) combinations of disclosed aspects and/or embodiments and/or (b) reasonable modifications not shown or described.

BRIEF DESCRIPTION OF THE DRAWINGS

Several embodiments in which the present disclosure can be practiced are illustrated and described in detail, wherein like reference characters represent like components throughout the several views. The drawings are presented for exemplary purposes and may not be to scale unless otherwise indicated.

FIG. 3A shows a depiction of a legend used to interpret the graphs of FIGS. 3B-3D.

FIG. 3B shows a depiction of a graph related to greenhouse gas emission data that can be interpreted using the legend of FIG. 3A.

Figure 1:
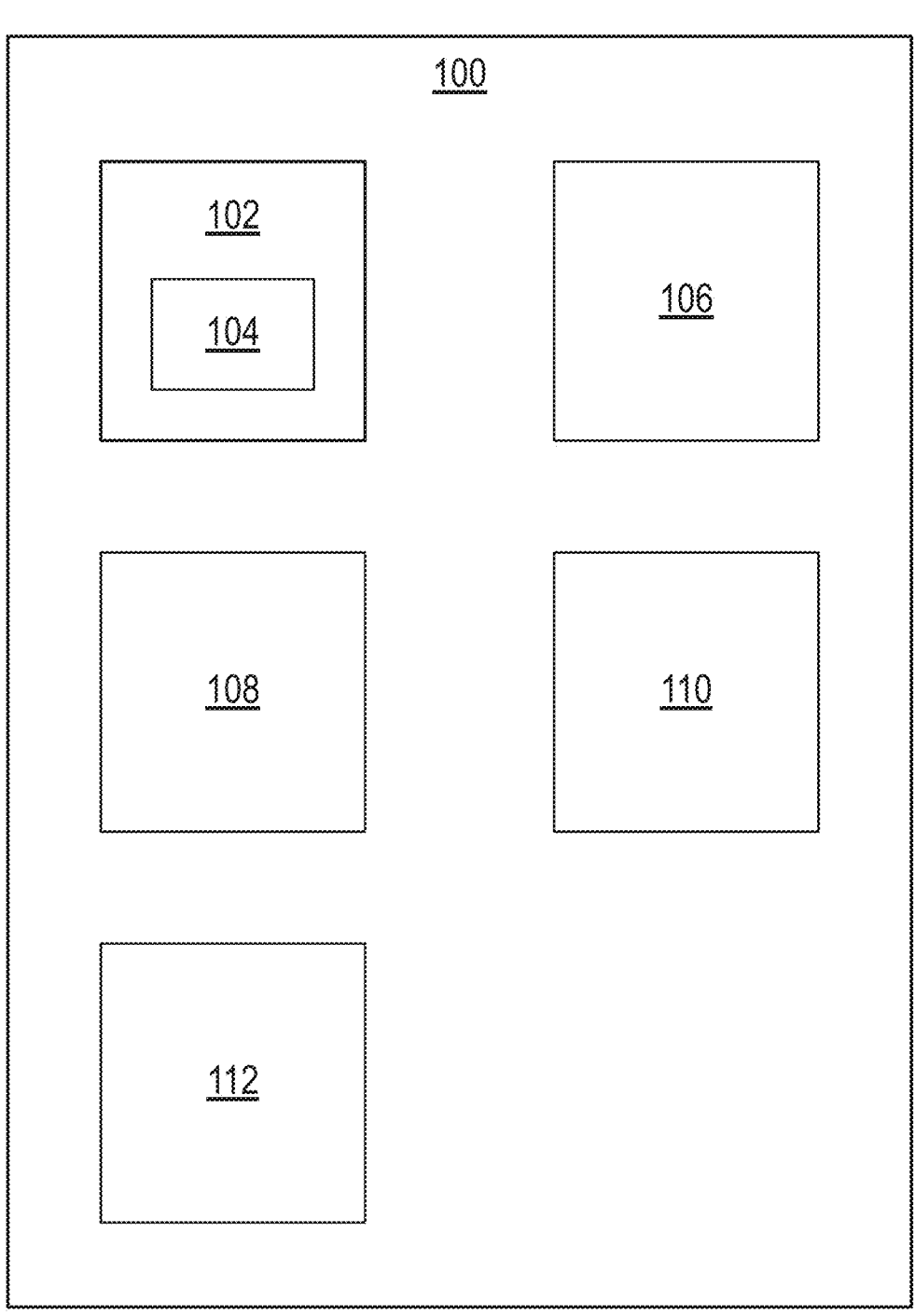
FIG. 1 shows a block diagram of a system used to perform systems modeling.

An artisan of ordinary skill in the art need not view, within isolated figure(s), the near infinite number of distinct permutations of features described in the following detailed description to facilitate an understanding of the present disclosure.

DETAILED DESCRIPTION

The present disclosure is not to be limited to that described herein. Mechanical, electrical, chemical, procedural, and/or other changes can be made without departing from the spirit and scope of the present disclosure. No features shown or described are essential to permit basic operation of the present disclosure unless otherwise indicated.

Unless defined otherwise, all technical and scientific terms used above have the same meaning as commonly understood by one of ordinary skill in the art to which embodiments of the present disclosure pertain.

The terms "a," "an," and "the" include both singular and plural referents.

The term "or" is synonymous with "and/or" and means any one member or combination of members of a particular list.

The term "and/or" where used herein is to be taken as specific disclosure of each of the two specified features or components with or without the other. Thus, the term "and/or" as used in a phrase such as "A and/or B" herein is intended to include "A and B," "A or B," "A" (alone), and "B" (alone). Likewise, the term "and/or" as used in a phrase such as "A, B, and/or C" is intended to encompass each of the following embodiments: A, B, and C; A, B, or C; A or C; A or B; B or C; A and C; A and B; B and C; A (alone); B (alone); and C (alone).

The terms "invention" or "present invention" are not intended to refer to any single embodiment of the particular invention but encompass all possible embodiments as described in the specification and the claims.

The term "about" as used herein refers to slight variations in numerical quantities with respect to any quantifiable variable. Inadvertent error can occur, for example, through use of typical measuring techniques or equipment or from differences in the manufacture, source, or purity of components.

The term "substantially" refers to a great or significant extent. "Substantially" can thus refer to a plurality, majority, and/or a supermajority of said quantifiable variable, given proper context.

The term "generally" encompasses both "about" and "substantially."

The term "configured" describes structure capable of performing a task or adopting a particular configuration. The term "configured" can be used interchangeably with other similar phrases, such as "constructed", "arranged", "adapted", "manufactured", and the like.

Terms characterizing sequential order, a position, and/or an orientation are not limiting and are only referenced according to the views presented.

The "scope" of the present disclosure is defined by the appended claims, along with the full scope of equivalents to which such claims are entitled. The scope of the disclosure is further qualified as including any possible modification to any of the aspects and/or embodiments disclosed herein which would result in other embodiments, combinations, subcombinations, or the like that would be obvious to those skilled in the art.

As used herein, the term "exemplary" refers to an example, an instance, or an illustration, and does not indicate a most preferred embodiment unless otherwise stated.

It should be noted that the terms "entity", "company" and/or "breeder" can be used interchangeably herein.

FIG. 1 shows a block diagram of a system 100. According to some embodiments, the system 100 can comprise a memory unit 102, executable instructions 104 that can be stored in and/or on the memory unit 102, a processing unit 106, a database 108, a communication module 110, and a human machine interface (HMI) 112.

The memory unit 102 can be and/or comprise any suitable computer memory and/or storage unit. The memory unit 102 can include, according to some embodiments, a program storage area and/or data storage area. The memory unit 102 can comprise read-only memory ("ROM", an example of non-volatile memory, meaning it does not lose data when it is not connected to a power source) and/or random-access memory ("RAM", an example of volatile memory, meaning it will lose its data when not connected to a power source). Nonlimiting examples of volatile memory include static RAM ("SRAM"), dynamic RAM ("DRAM"), synchronous DRAM ("SDRAM"), etc. Examples of non-volatile memory include electrically erasable programmable read only memory ("EEPROM"), flash memory, hard disks, SD cards, etc.

According to some embodiments, the memory unit 102 can be and/or comprise a non-transitory computer-readable medium. In communications and computing, a computer readable medium is a medium capable of storing data in a format readable by a mechanical device. The term "non-transitory" is used herein to refer to computer readable media ("CRM") that store data for short periods or in the presence of power such as a memory device. According to some embodiments, the non-transitory computer readable medium can be a tangible non-transitory computer readable medium.

The memory unit 102 can be used to store executable instructions 104. When executed, the executable instructions 104 cause the system 100 and/or any cyberinfrastructure described herein to perform any method(s) and/or methodolog(ies) described herein. The instructions 104 can be stored, completely or at least partially, within the memory unit 102 and/or any other aspect of the system 100. When executed, the executable instructions 104 can perform the method 200 depicted in FIG. 2 and described below.

As shown in FIG. 1, the system 100 further includes a processing unit 106. The processing unit 106 can be operatively connected to the memory unit 102 and can execute software instructions that are capable of being stored in a RAM of the memory (e.g., during execution), a ROM of the memory (e.g., on a generally permanent basis), or any sort of non-transitory computer readable medium such as another memory or a disc. For example, the processing unit 106 can be configured to perform, run, carry out, and/or otherwise execute the executable instructions 104.

The processing unit 106 is an electronic circuit which performs operations on some external data source, usually memory or some other data stream. The processing unit 106 can be and/or comprise any number of processors ranging from 1 to N where N is number greater than 1. Non-limiting examples of processors include a processor, a microprocessor, a controller, a microcontroller, an arithmetic logic unit ("ALU"), a graphics processing unit ("GPU"), and most notably, a central processing unit ("CPU"). A CPU, also called a central processor or main processor, is the electronic circuitry within a computer that carries out the instructions of a computer program by performing the basic arithmetic, logic, controlling, and input/output ("I/O") operations specified by the instructions. Processing units are common in tablets, telephones, handheld devices, laptops, user displays, smart devices (TV, speaker, watch, etc.), and other computing devices. The processing unit 106 can further include components for establishing communications. The processing unit 106 can also include other components and can be implemented partially or entirely on a semiconductor (e.g., a field-programmable gate array ("FPGA")) chip, such as a chip developed through a register transfer level ("RTL") design process.

According to some embodiments, GPU-based computing can be used in one or more aspects. GPU-based computing refers to the practice of using a GPU simultaneously with one or more central processing units (CPUs) and/or GPUs. GPU-based computing allows for a sort of parallel processing between the GPU and the one or more CPUs and/or GPUs such that the GPU can take on some of the computational load to increase speed and efficiency. Additionally, GPUs commonly have a much higher number of processing cores than a traditional CPU, which allows a GPU to be able to process pictures, images, and/or graphical data faster than a traditional CPU.

According to some embodiments, the non-transitory computer readable medium operates under control of an operating system stored in a memory, such as the memory 102. The non-transitory computer readable medium implements a compiler which allows a software application written in a programming language such as COBOL, C++, FORTRAN, or any other known programming language to be translated into code readable by the central processing unit. After completion, a central processing unit, such as the processing unit 106, accesses and manipulates data stored in the memory of the non-transitory computer readable medium using the relationships and logic dictated by a software application and generated using the compiler.

According to some embodiments, the software application and the compiler are tangibly embodied in the computer-readable medium. When the instructions are read and executed by the non-transitory computer readable medium, the non-transitory computer readable medium performs the steps necessary to implement and/or use aspects of the present disclosure. A software application, operating instructions, and/or firmware (semi-permanent software programmed into read-only memory) may also be tangibly embodied in the memory and/or data communication devices, thereby making the software application a product or article of manufacture according to the present disclosure.

As shown in FIG. 1, the system 100 can further include a database 108. The database 108 can be a structured set of data held and/or stored such that it can be accessed by the system 100. The database 108, as well as data and information contained therein, need not reside in a single physical or electronic location. For example, the database 108 may reside, at least in part, on a local storage device, in an external hard drive, on a database server connected to a network, on a cloud-based storage system, in a distributed ledger (such as those commonly used with blockchain technology), and the like.

As shown in FIG. 1, the system 100 can further include a communications module 110. The communications module 110 can be configured to be able to send data to and/or receive data from various components within the system 100. Additionally, the communications module 110 can be configured to be able to send data to and/or receive data from entities external to the system 100. For example, the communications module 110 can connect to a third-party entity to receive data from and/or send data to said entity. Such data can be historical data. According to some embodiments, such historical data can be related to farm management practices, market conditions, climate conditions, and/or any other types of historical data described herein. Such historical data is described in detail herein. Additionally, according to some embodiments, the communications module 110 can connect to a third-party entity to receive and/or send data related to future, projected, and/or forecasted data. Such future, projected, and/or forecasted data is described in detail herein.

The communications module 110 can include any combination of modem(s), router(s), access point(s), bridge(s), gateway(s), hub(s), repeater(s), switch(es), transceiver(s), and the like in order to facilitate communication. The communications module 110 can be configured to perform data communication wirelessly and/or in a wired fashion. The communications module 110 can include one or more communications ports such as Ethernet, serial advanced technology attachment ("SATA"), universal serial bus ("USB"), or integrated drive electronics ("IDE"), for transferring, sending, receiving, and/or or storing data.

According to some embodiments, the communications module 110 and/or other components of the system 100 are able to perform data communication either within the system 100 and/or externally of the system 100 in a wireless fashion using any sort of wireless connection device and/or protocol. This can include, but is not limited to, Bluetooth, Wi-Fi, cellular data, radio waves, satellite, and/or generally any other form of wireless connection. Therefore, the communications module 110 and/or any other component(s) of the system 100 will include generally any electronic components necessary to allow for such wireless communication.

According to some embodiments, the communications module 110 and/or other components of the system 100 are able to perform data communication either within the system 100 and/or externally of the system 100 via a wired connection. Wired communication can take the form of CAN bus, Ethernet, co-axial cable, fiber optic line, and/or generally any other device and/or protocol which will allow for wired communication. Therefore, the communications module 110 and/or any other component(s) of the system 100 will include generally any electronic components necessary to allow for such wired communication.

According to some embodiments, the communications module 110 and/or other components of the system 100 are able to perform data communication either within the system 100 and/or externally of the system 100 via a network. According to some embodiments, the network is, by way of example only, a wide area network ("WAN") such as a TCP/IP based network or a cellular network, a local area network ("LAN"), a neighborhood area network ("NAN"), a home area network ("HAN"), or a personal area network ("PAN") employing any of a variety of communication protocols, such as Wi-Fi, Bluetooth, ZigBee, near field communication ("NFC"), etc., although other types of networks are possible and are contemplated herein. Communications through the network can be protected using one or more encryption techniques, such as those techniques provided by the Advanced Encryption Standard (AES), which superseded the Data Encryption Standard (DES), the IEEE 802.1 standard for port-based network security, pre-shared key, Extensible Authentication Protocol ("EAP"), Wired Equivalent Privacy ("WEP"). Temporal Key Integrity Protocol ("TKIP"), Wi-Fi Protected Access ("WPA"), and the like.

Ethernet is a family of computer networking technologies commonly used in local area networks ("LAN"), metropolitan area networks ("MAN") and wide area networks ("WAN"). Systems communicating over Ethernet divide a stream of data into shorter pieces called frames. Each frame contains source and destination addresses, and error-checking data so that damaged frames can be detected and discarded; most often, higher-layer protocols trigger retransmission of lost frames. As per the OSI model, Ethernet provides services up to and including the data link layer. Ethernet was first standardized under the Institute of Electrical and Electronics Engineers ("IEEE") 802.3 working group/collection of IEEE standards produced by the working group defining the physical layer and data link layer's media access control ("MAC") of wired Ethernet. Ethernet has since been refined to support higher bit rates, a greater number of nodes, and longer link distances, but retains much backward compatibility. Ethernet has industrial application and interworks well with Wi-Fi. The Internet Protocol ("IP") is commonly carried over Ethernet and so it is considered one of the key technologies that make up the Internet.

The Internet Protocol ("IP") is the principal communications protocol in the Internet protocol suite for relaying datagrams across network boundaries. Its routing function enables internetworking, and essentially establishes the Internet. IP has the task of delivering packets from the source host to the destination host solely based on the IP addresses in the packet headers. For this purpose, IP defines packet structures that encapsulate the data to be delivered. It also defines addressing methods that are used to label the datagram with source and destination information.

The Transmission Control Protocol ("TCP") is one of the main protocols of the Internet protocol suite. It originated in the initial network implementation in which it complemented the IP. Therefore, the entire suite is commonly referred to as TCP/IP. TCP provides reliable, ordered, and error-checked delivery of a stream of octets (bytes) between applications running on hosts communicating via an IP network. Major internet applications such as the World Wide Web, email, remote administration, and file transfer rely on TCP, which is part of the Transport Layer of the TCP/IP suite.

Transport Layer Security, and its predecessor Secure Sockets Layer ("SSL/TLS"), often runs on top of TCP. SSL/TLS are cryptographic protocols designed to provide communications security over a computer network. Several versions of the protocols find widespread use in applications such as web browsing, email, instant messaging, and voice over IP ("VoIP"). Websites can use TLS to secure all communications between their servers and web browsers.

As shown in FIG. 1, the system 100 can further comprise a human machine interface (HMI) 112. The HMI 112, which can also be referred to as a user interface and/or a visualization portal, is how a user interacts with a machine. The HMI 112 can be a digital interface, a command-line interface, a graphical user interface ("GUI"), oral interface, virtual reality interface, or any other way a user can interact with a machine (user-machine interface). For example, the HMI 112 can include a combination of digital and analog input and/or output devices or any other type of user interface input/output device required to achieve a desired level of control of, interaction with, and/or monitoring of a device. Nonlimiting examples of input and/or output devices include computer mice, keyboards, touchscreens, knobs, dials, toggles, levers, sliders, switches, buttons, speakers, microphones, printers, LIDAR, RADAR, etc.

A user can use the HMI 112 to input information and/or data into the system 100. Inputting information into the system 100 via the HMI 112 can include modifying information and/or data displayed via the HMI 112 and/or entering new information and/or data. Input(s) received via the HMI 112 can be processed via the system 100 and/or components thereof such as the processing unit 106. The HMI 112 can be used by the system 100, and/or any components thereof, to display information, data, text, graphics, graphs, charts, toggles, levers, sliders, tabs, and the like.

According to some embodiments, the system 100 can be implemented and/or accessed as a downloadable computer application to be stored on a device such as a computer, laptop, phone, tablet, smart device, and the like. According to some embodiments, the system 100 can be implemented and/or accessed online via cloud computing. According to some embodiments, the system 100 can be implemented via cloud computing as a Software as a Service (Saas), Platform as a Service (PaaS), and/or Infrastructure as a Service (IaaS). The system 100 could utilize any sort of cloud computing deployment model such as a private cloud, a community cloud, a public cloud, and/or a hybrid cloud.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service.

A cloud computing environment is service oriented with a focus on statelessness, low coupling, modularity, and semantic interoperability. At the heart of cloud computing is an infrastructure comprising a network of interconnected nodes.

All components of the system 100 including, but not limited to, the memory unit 102, the executable instructions 104, the processing unit 106, the database 108, the communication module 110, and/or the HMI 112 can be operatively connected, via a common bus and/or any other suitable connection element, such that all components of the system 100 can be in communication with each other.

Figure 2:
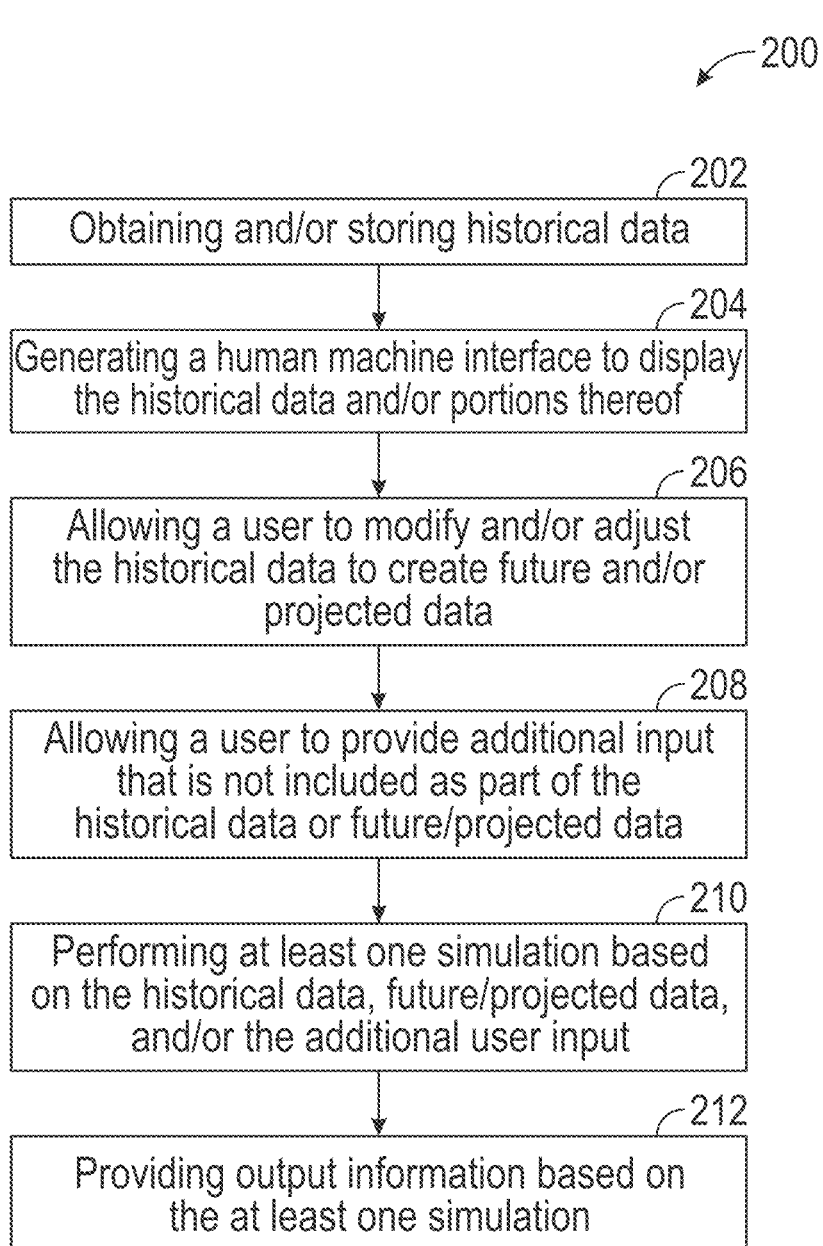
FIG. 2 shows a flow chart of a method used to perform systems modeling.

FIG. 2 shows a flow chart depicting a method 200 that involves using systems modeling to perform simulation(s) and to output results based on said simulation(s). It is noted that the terms "output data", "results", and "outcomes" when used in terms of simulation(s) can be used interchangeably herein.

One or more embodiments described herein, including embodiments of the method 200, can be implemented using programmatic modules, engines, or components. A programmatic module, engine, or component can include a program, a sub-routine, a portion of a program, or a software component or a hardware component capable of performing one or more stated tasks or functions. A module or component can exist on a hardware component independently of other modules or components. Alternatively, a module or component can be a shared element or process of other modules, programs, or machines.

Dedicated hardware implementations including, but not limited to, application specific integrated circuits, programmable logic arrays, and/or other hardware devices can likewise be constructed to implement the methods described herein, including embodiments of the method 200. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, methods, including the method 200, and/or systems, including the system 100, described herein are applicable to software, firmware, and hardware implementations.

In accordance with various embodiments of the subject disclosure, the methods described herein, including embodiments of the method 200, can function as software programs running on a computer processor. Furthermore, software implementations of the methods and/or systems described herein can include, but are not limited to, distributed processing and/or component/object distributed processing, parallel processing, and/or virtual machine processing.

The method 200 can be performed via any suitable system, cyberinfrastructure, computer, computer application, software application, and the like. According to some embodiments, the system 100, and/or any components thereof, can be used to perform the method 200.

As shown in FIG. 2, the method 200 can include the step 202 of obtaining and/or storing historical data. The historical data can be related to any sort of data relevant to agriculture, conservation, sustainability, economics, farm management, climate, and the like. For example, according to some embodiments, the historical data includes, but is not limited to, historical farm management data, historical market data, and/or historical climate data.

Historical data can further include historical public policy data and/or historical environmental data such as soil organic matter data. Such data is readily available and accessible from a number of sources. However, it should be noted that the specific source or number of historical data is not to be limiting on the disclosure, and that the systems and/or methods disclosed can be functional using the types of historical data suggested, regardless of the source(s).

Farm management data can include conservation practice data such as the use of no-till and/or cover crop usage, chemical application data, herbicide application data, pesticide application data, fertilizer application data, nitrogen application data, chemical application data, seeding rate data, water application data, and the like. Application data, such as fertilizer application, pesticide application, herbicide application, water application, nitrogen application, chemical application, and/or any other type of material application could include timing, amount, and/or technique of application and could further include technology used for application. Farm management data can be acquired from any number of farm management entities to be able to compile and review the data that is being input, uploaded, or otherwise acquired from such farm management systems. It should be appreciated that the present disclosure is not to be limited by the usage of one or more types or sources of farm management data, and the more data that can be input into the methods and/or systems disclosed will provide better outcomes.

Market data can relate to the agricultural and/or crop market. Market data can relate to a specific crop. For example, market data can refer to data related to the corn market, data related to the soybean market, and/or data related to any other crop market. Market data can include market conditions, market information, market metrics, market indicators, market trends, market share related to specific entities, and the like.

Market data can include, but is not limited to, pricing data (including price relative to a baseline for a particular product produced by a particular entity), maximum product acres share percentage data (including maximum market adoption percentage and/or maximum market share achievable by a particular entity for a particular product and/or crop), first year product adoption percentage data (including first year product adoption percentage for a particular product produced by a particular entity), annual growth percentage data (including annual market growth percentage of a particular product produced by a particular entity), market demand data (including increases and/or decreases in market demand for a particular product produced by a particular entity and/or market demand based on a crop type as a whole on a macro scale), base annual percentage demand growth data, percentage ramp change in demand, ramp year, market supply data (including increases and/or decreases in market supply for a particular product produced by a particular entity). Pricing data can include, but is not limited to, price of particular agricultural products relative to a baseline, market price of particular agricultural products at different moments in time, and the like. Further, market data can refer to a single crop, such as corn or soybeans, a particular product produced by a particular entity, and/or a larger portion of the agricultural market as a whole. Market data can also be obtained from any number of sources that have such data. The source of particular market data should not be limiting on the present disclosure, and it should be appreciated that the sourcing of the data can be varied according to specific usage of the present disclosure to obtain the desired scenarios and simulations.

Climate data can relate to the climate on a local scale (such as a county scale), a state scale, a region scale within a country such as the United States of America, a national scale, a region scale around the world, and/or on a global scale. Climate data can include climate conditions, climate information, climate metrics, climate indicators, climate trends, and the like.

Climate data can include but is not limited to, drought data, water saturation data, temperature data, humidity data, wind data, sunlight data, cloud cover data, rainfall data, natural disaster events, topography data, data related to the percentage of biomass achievable after precipitation related to particular product(s) produced by particular entities, rain events, and/or heat events. Climate data can further include climate conditions based on assumptions of greenhouse gas emissions. Climate data can be accessed from a number of sources, such as from NASA databases or other US databases. These can be accessed online. For outside the United States, many governments and/or governmental agencies around the world provide online climate databases that can be accessed and used for the system(s)/method(s) as disclosed herein.

Historical data, including, but not limited to, farm management data, market data, and/or climate data, can be obtained from a database (wherein the database could be a locally hosted database, an on-premise database, a cloud-based database, a database available online, and/or any other type of database), any sort of memory unit, an online repository, and the like.

Historical data can be obtained wirelessly and/or via a wired connection. For example, historical data can be obtained in any manner and/or via any components described above with regard to the system 100. For example, step 202 of the method 200 could utilize a communications module, device, and/or component. According to some embodiments, such communications module, device, and/or component could be the communications module 110 described above. For example, historical data can be obtained via a network and/or via the use of Bluetooth, Wi-Fi, cellular data, radio waves, satellite, and/or generally any other form of wireless connection. Additionally, historical data can be obtained via USB drive, hard disc, CAN bus, Ethernet, co-axial cable, fiber optic line, or generally any other device and/or protocol which will allow for wired and/or physical communication.

Step 202 of the method 200 can include storing historical data. Historical data can be stored in a database and/or any kind of memory unit. The database may reside, at least in part, on a local storage device, in an external hard drive, on a database server connected to a network, on a cloud-based storage system, in a distributed ledger (such as those commonly used with blockchain technology), or the like, According to some embodiments, the historical data could be stored in/on the database 108 and/or the memory unit 102 of the system 100.

Step 202 of the method 200 can further include creating a historical baseline dataset based on the historical data. According to some embodiments, any of the historical data which includes, but is not limited to, historical farm management data, historical market data, and/or historical climate data, can be automatically (and/or manually) compiled, organized, and/or analyzed to create a historical baseline dataset. According to some embodiments, climate data can be obtained from the National Oceanic and Atmospheric Administration (NOAA). The NOAA creates various climate models. For example, the system 100 and/or the method 200 can utilize the NOAA's climate model RCP 8.5 according to some embodiments. The historical baseline dataset can include all, some, and/or none of the historical data. The historical baseline dataset can include assumptions. As described below, the historical baseline dataset can be manipulated by a user via the HMI. Additionally, as described below, the historical baseline dataset can be utilized by other steps of the method 200.

As shown in FIG. 2, the method 200 can further include the method step 204, which includes generating an HMI to display the historical data and/or portions thereof. This step 204 can further include displaying said HMI. Again, the HMI generated and displayed by step 204 of the method 200 can be the HMI 112 described above while referring to the system 100. The generated and displayed HMI can include many different data visualization techniques including, but not limited to, information, data, text, graphics, graphs, charts, toggles, levers, sliders, tabs, and the like.

As shown in FIG. 2, the method 200 can further include the method step 206, which includes allowing a user to modify and/or adjust historical data to create future and/or projected data. As noted, the HMI generated and displayed in the step 204 of the method 200 can include, but is not limited to, information, data, text, graphics, graphs, charts, toggles, levers, sliders, tabs, and the like. Thus, a user can manipulate, modify, alter, and/or otherwise interact with the historical data to create future data via the HMI. A user can manipulate, modify, alter, and/or otherwise interact with the historical data via any suitable input device and/or means, such as any input device and/or means described herein. For example, a user can manipulate, modify, alter, and/or interact with the historical data and/or the HMI via computer mice, keyboards, touchscreens, knobs, dials, toggles, levers, sliders, switches, buttons, speakers, microphones, printers, LIDAR, RADAR, and the like.

A user can manipulate, modify, alter, and/or interact with the historical data to create a future baseline dataset. For example, if a user believes that drought frequency will increase by 7% over the next 20 years, the user can modify the historical data to reflect this belief and/or assumption. As another example, if a user believes that market demand will increase for a particular crop product (perhaps due to increasing development, natural disaster, war, increase in population, use of biofuels, etc.) and/or decrease for a particular crop, the user can modify the historical data to reflect this belief or assumption. A user is able to modify any of the historical data. According to some embodiments, the user can create a future baseline dataset by manipulating, modifying, altering, and/or interacting with the historical data in this manner. Thus, the future baseline dataset and/or future data can include all types of data that can be included as part of the historical data and/or historical baseline dataset including, but not limited to, future farm management data, future market data, and/or future climate data. Future data can further include future public policy data and/or future environmental data such as soil organic matter data. Future farm management data, future market data, and/or future climate data can include, but is not limited to, any of the types of farm management data, market data, and/or climate data noted above with regard to historical data. The future baseline dataset can include all, some, and/or none of the future data. The future baseline dataset can include any assumptions that the user would like to include. Additionally, as described herein, the future baseline dataset can be utilized by other steps of the method 200. The future baseline dataset can be constructed by the user via the HMI to suit the assumptions, desires, and/or preferences of the user.

As described, according to some embodiments, the user can manipulate, modify, alter, and/or interact with the historical data to create a future baseline dataset via the HMI. According to some embodiments, a user can manipulate, modify, alter, and/or interact with historical data in order to create a future baseline dataset via computer software coding or any other suitable method at the time the HMI is created. According to some embodiments, multiple future baseline datasets can be created wherein the different future baseline datasets contain different data and/or assumptions. For example, while one future baseline dataset can assume that drought frequency will increase by 8% over the next 20 years, another future baseline dataset could assume that drought frequency will increase by 4% over the next 20 years, and even another future baseline dataset could assume that drought frequency will decrease by 6% over the next 30 years. A user can then choose to implement and/or apply any and/or all of the future baseline datasets when performing one or more simulations. As another example, a user can choose to use historical climate data based on assuming no change in future greenhouse gas emissions, a user can choose to use future/projected climate data based on assuming a significant increase in future/projected greenhouse gas emissions, and/or a user can choose to use more conservative future/projected climate data based on assuming a less significant increase in future/projected greenhouse gas emissions.

As noted, a user can specify a future baseline dataset wherein the future baseline dataset represents aggressive projections for future data. The same user can also specify another future baseline dataset wherein the second future baseline dataset represents more conservative and/or different projections for future data. The user can then apply both future baseline datasets to the other steps of the method 200.

By including the ability to create future baseline datasets, the method 200 and/or system 100 can allow one user to create future baseline datasets with that user's preferred data and/or assumptions, and a second user (or the same user) can choose which future baseline datasets to implement and/or apply when performing one or more simulations.

As shown in FIG. 2, the method 200 further includes the step 208 of allowing a user to provide additional input that is not included as part of the historical data and/or the future/projected data. According to some embodiments, such additional input can relate to specific crop product(s) produced by a specific company/breeder. Such additional input can comprise input relating to factors that include, but are not limited to, magnitude of crop yield improvement, product launch year, fertilizer consumption (including a change in required inputs for fertilizer; wherein fertilizer can include nitrogen, phosphorous, and/or potassium), fertilizer consumption per bushel change from baseline, pesticide consumption (including a change in required chemical/ pesticide inputs), pesticide consumption per bushel change from baseline, soil carbon data (including a change in required carbon inputs for fertilizer), soil carbon data related to per bushel change from baseline, yield per acre, yield per acre increase, maximum bushel per acre data, nitrogen use efficiency, nitrogen use efficiency of competitors, water use efficiency, water use efficiency of competitors, yield percentage change by crop, years to phase in yield percentage change, price percentage difference by crop, years to phase in price percentage change, grain percentage of biomass, pricing information, price percentage of competitors at an initial time period, price percentage of competitors at a final time period, seeding rate, carbon impact, yield increase percentage, years to phase in yield percentage increase, product improvements (such as increased yield capability and/or resource use efficiency), plant nitrogen uptake, maximum yield data compared to competitor product(s), first year adoption percentage, annual growth percentage, annual growth maximum percentage, and/or acre increase percentage.

Additionally, according to some embodiments, additional input data can include pricing data (including price relative to a baseline for a particular product produced by a particular entity), maximum product acres share percentage data (including maximum market adoption percentage and/or maximum market share achievable by a particular entity for a particular product and/or crop), first year product adoption percentage data (including first year product adoption percentage for a particular product produced by a particular entity), annual growth percentage data (including annual market growth percentage of a particular product produced by a particular entity), market demand data (including increases and/or decreases in market demand for a particular product produced by a particular entity and/or market demand based on a crop type as a whole on a macro scale), base annual percentage demand growth data (for a particular product produced by a particular entity and/or based on a crop type as a whole on a macro scale), percentage ramp change in demand, ramp year, market supply data (for a particular product produced by a particular entity). Pricing data can include, but is not limited to, price of particular agricultural products relative to a baseline, market price of particular agricultural products at different moments in time, and the like.

Additionally, according to some embodiments, additional input data can include water needs of a particular product(s) produced by a particular entity and/or data related to the percentage of biomass achievable after precipitation related to particular product(s) produced by particular entities.

According to some embodiments, this additional input and/or additional factors can relate to a particular agricultural product such as a particular brand, variety, and/or line of a crop. As an example, the additional input/additional factors could relate to a single variety of a single crop produced by a single entity. For instance, the additional input/additional factors could relate to Variety X of corn produced by Company Y. According to some embodiments, the additional input/additional factors could relate to a single crop produced by a single entity. For instance, the additional input/additional factors could relate to soy beans (regardless of variety) produced by Company Z. According to some embodiments, the additional input/additional factors could relate to a variety of crops produced by a single entity and/or to a single crop produced by a variety of entities.

In order for a user to provide the additional input/modify additional factors, the HMI can include any sort of input devices and/or means including, but not limited to, computer mice, keyboards, touchscreens, knobs, dials, toggles, levers, sliders, switches, buttons, speakers, microphones, printers, LIDAR, RADAR, etc. Particularly, according to some embodiments, the HMI can include levers, toggles, sliders, and/or buttons, wherein a user can manipulate such levers, toggles, sliders, and/or buttons via a computer mouse and/or via a touchscreen. Thus, a user can quickly and easily enable, disable, modify, alter, edit, and/or specify particular variables via the HMI.

As shown in FIG. 2, the method 200 can further include the step 210 which involves performing at least one simulation based on historical data, future/projected data, and/or the additional user input. The method 200 also includes the step 212 which involves providing output information and/or data based on the at least one simulation. The step 210 involves using the historical data, future data, and/or additional user input based on the specifications of the user. For instance, when creating a historical baseline dataset, the user can choose which, if any, historical data is desirable. Similarly, when creating the future baseline dataset, the user can choose which, if any, future data is desirable. Again, similarly, when entering additional input, the user can choose which additional input to enter and/or which additional input to modify. In this way, the user can completely control and/or specify the inputs used to perform the one or more simulations. Again, the system 100 can be used to perform the one or more simulations.

Based on the user specifications, one or more simulations can be performed. Performing the simulations involves combining, applying, implementing, and/or analyzing all the user-specified inputs to create output data. Output data represents projections and/or predictions of data including, but not limited to, agricultural outcomes, market outcomes, environmental outcomes, farm management outcomes, and the like. For example, output data can include, but is not limited to, data related to company market share by crop/product, profit per acre by crop/product and/or by entity, crop production (number of bushels) in the United States and/or in a smaller or larger region, acres planted (by crop/product and/or by breeder/company), farmed acres (by crop/product and/or by breeder/company), harvested acres (by crop/product and/or breeder/company), greenhouse gas emissions (including calculation of greenhouse gas emissions equivalents such as carbon dioxide equivalents), carbon value, water consumption, runoff (including, but not limited to, chemical, nitrate, nitrogen, fertilizer, pesticide, herbicide, and/or nutrient runoff), water use, land use, economic metrics at a commodity market level (including, but not limited to, price, yield, acres planted by product, and/or total acres planted), economic metrics at a farm level (including, but not limited to, yield trends, yield stacked trends, total value less costs per acre, value less costs per acre by crop/product, revenue per acre, revenue and costs by breeder/company, financial details by breeder/company, fertilizer costs per acre, profits), price information, carbon cost and/or savings information, climate impact predictions (including, but not limited to, precipitation, temperature, rain events, and/or heat events), market share growth by company/entity, market share maximum by company/entity, air pollution, water pollution, and/or irrigation information (including, but not limited to, irrigation trends, runoff by nutrient, current stack irrigation, and/or current stack runoff).

All of the output data points/metrics described above can be calculated by the simulation(s) on a cumulative basis and/or on a per bushel basis. For example, greenhouse gas emission output data can include change in greenhouse gas emissions calculated on a total/cumulative basis (spanning the entire length of the simulation time period) and/or on a per bushel basis. Fertilizer and/or runoff output data can also include change in fertilizer applied data calculated on a total/cumulative basis and/or on a per bushel basis. Land use output data can also include change in land harvested calculated on a total/cumulative basis and/or on a per bushel basis. Water use output data can also include change in water used in irrigation calculated on a total/cumulative basis and/or on a per bushel basis. Output data related to profits can also include change in farm profits calculated on a total/cumulative basis and/or on a per bushel basis.

A simulation can be run over a specified number of years. For example, a user could choose to run a simulation over the years 2025-2030. As another example, a user could choose to run a simulation over the years 2024-2042. The period of time of which a simulation is run can span any future time frame. For example, the beginning of the period of time in which a simulation is run must be in the future and the end of the period of time can be any time after said beginning.

Further, the results of the simulation(s) and/or the output data based on the simulation(s) can be provided and/or displayed in a manner showing total impact/results and/or can be provided and/or displayed in a manner showing impacts/results over time. For example, the total impact/results can be provided wherein the total impact/results are shown in the specified time range of the simulations based on the latest run versus the baseline dataset. Showing the results/impact over time can show how a particular output metric will likely trend over time based on the input data.

Step 210 of performing one or more simulations can involve the use of a modeling framework. Such modeling frameworks can comprise different systems modeling and/or dynamic systems modeling techniques and/or practices including, but not limited to, discrete event modeling, agent-based modeling, system dynamics, and/or multi-method modeling. Additionally, the method can utilize advanced modeling analytics including, but not limited to, optimization, calibration, sensitivity analysis, feedback loops (including dominant feedback loops), the ability to trace the cause of a variable's behavior, and the like.

Discrete event modeling, also known as discrete event simulation, involves modeling the operation of a system wherein each event occurs at a particular time and indicates a change in the system. Discrete event modeling can include the use of next-event time progression, incremental time progression, and/or continuous simulation.

Agent-based modeling can be used to simulate actions and/or interactions of autonomous agents. Agent-based modeling allows an operator to better understand how a system works and what variables and/or data affect outcomes. Agent-based modeling can apply elements of game theory, complex systems, emergence, computational sociology, multi-agent systems, and/or evolutionary programming. Agent-based modeling involves simulating the interaction of actions of several different agents in an attempt to forecast and/or predict future outcomes. In agent-based modeling it is possible to analyze and determine which kinds of seemingly micro actions performed by different agents will result in macro-level outcomes for the system as a whole.

System dynamics can be used to help understand the dynamic and/or nonlinear behavior of complex systems. System dynamics recognizes that the structure of a system, including how each of its components interact with each other and the timing of such interactions, can be just as important in predicting outcomes of the system as the actions of each individual component. System dynamics can be helpful when properties of an entire system cannot be explained in terms of the behavior of components of the system.

Multi-method modeling can combine the use of multiple modeling techniques. For example, multi-method modeling can combine the use of discrete event modeling, agent-based modeling, and/or system dynamics to better understand a system having input(s) and output(s).

The system 100 and/or method 200 can apply one or more modeling frameworks when performing simulation(s). According to some embodiments, such modeling frameworks can be developed, applied, and/or improved using artificial intelligence (AI) and/or machine learning.

According to some embodiments, AI can be used in one or more aspects of the present disclosure. AI is intelligence embodied by machines, such as computers and/or processors. While AI has many definitions, some have defined AI as utilizing machines and/or systems to mimic human cognitive ability such as decision-making and/or problem solving. AI has additionally been described as machines and/or systems that are capable of acting rationally such that they can discern their environment and efficiently and effectively take the necessary steps to maximize the opportunity to achieve a desired outcome. Goals of AI can include, but are not limited to, reasoning, problem-solving, knowledge representation, planning, learning, natural language processing, perception, motion and manipulation, social intelligence, and general intelligence. AI tools used to achieve these goals can include but are not limited to searching and optimization, logic, probabilistic methods, classification, statistical learning methods, artificial neural networks, machine learning, and deep learning.

According to some embodiments, machine learning can be used in one or more aspects of the present disclosure. For example, machine learning can be used to develop, train, apply, and/or improve the one or more modeling frameworks used when performing simulation(s). Machine learning is a subset of artificial intelligence. Machine learning aims to learn or train via training data in order to improve performance of a task or set of tasks. A machine learning algorithm and/or model can be developed such that it can be trained using training data to ultimately make predictions and/or decisions. Machine learning can include different approaches such as supervised learning, unsupervised learning, semi-supervised learning, reinforcement learning, and dimensionality reduction as well as other types. Supervised learning models are trained using a training data that includes inputs and the desired output. This type of training data can be referred to as labeled data wherein the output provides a label for the input. The supervised learning model will be able to develop, through optimization or other techniques, a method and/or function that is used to predict the outcome of new inputs. Unsupervised learning models take in data that only includes inputs and engage in finding commonalities in the inputs such as grouping or clustering of aspects of the inputs. Thus, the training data for unsupervised learning does not include labeling and/or classification. Unsupervised learning models can make decisions for new data based on how alike or similar the new data is to existing data and/or to a desired goal. Examples of machine learning models include but are not limited to artificial neural networks, decision trees, support-vector machines, regression analysis, Bayesian networks, and genetic algorithms. Examples of potential applications of machine learning include but are not limited to image segmentation and classification, ranking, recommendation systems, visual identity tracking, face verification, and speaker verification.

According to some embodiments, deep learning can be used in one or more aspects of the present disclosure. For example, deep learning can be used to develop, train, apply, and/or improve the one or more modeling frameworks used when performing simulation(s). Deep learning is a subset of machine learning that utilizes a multi-layered approach. Examples of deep learning architectures include but are not limited to deep neural networks, deep belief networks, deep reinforcement learning, recurrent neural networks, and convolutional neural networks. Examples of fields wherein deep learning can be successfully applied include but are not limited to computer vision, speech recognition, natural language processing, machine translation, bioinformatics, medical image analysis, and climate science. Deep learning models are commonly implemented as multi-layered artificial neural networks wherein each layer can be trained and/or can learn to transform particular aspects of input data into some sort of desired output.

The method step 210 of the method 200 is able to automatically perform one or more simulations using modeling framework(s). The method step 210 is able to compile, combine, organize, and/or analyze all of the input data (which could include historical data, future/projected data, and/or other additional data) and then is able to generate output data that includes predictions and/or projections based on said input data.

Additionally, the method step 210 can be used to perform multiple simulations based on different input data. Different historical data could be used and/or different future/projected data could be used in different simulations. For example, one future baseline dataset could include more aggressive projections and another future baseline dataset could include more conservative projections. Multiple simulations could be run using the two different future baseline datasets. In such situations wherein different input data is used for different simulation(s), the output data can include comparisons between the differences of the outcomes based on using one baseline dataset relative to the other.

Additionally, any steps of the method 200 can be repeated. For example, a user can specify a baseline dataset, enter additional input, and then run a simulation. Upon reviewing the output data (also known as results) of the simulation, the user can then change the baseline dataset, additional input, and/or any other input(s) and run another simulation. The new output data from the second simulation can include the output data from the first simulation such that the output data of both simulations can be compared and any differences and/or similarities between the two simulations can be viewed by a user. While only two different inputs, simulations, and outputs were described in this example, any number of inputs, simulations, and/or outputs can be compared.

Step 212 of the method 200 includes providing output information and/or data based on at least one simulation. Providing the output information/data can include displaying such output information via the HMI, which, according to some embodiments, could be the HMI 112 of the system 100. The output information/data can be provided and/or displayed in many different forms including, but not limited to, text, numbers, graphics, graphs, charts, tabs, and the like.

As described above, the output data and/or results of the simulation(s) can include a multitude of different pieces of information. For example, the output data and/or results of the simulation(s) can provide predictions and/or projections related to environmental metrics (such as greenhouse gas emissions, chemical runoff, water use metrics, and the like), financial metrics (such as profit per acre, revenue per acre, market share, and the like), farming metrics (such as acres harvested, yield, and the like), and the like.

Therefore, users can use the method 200 and/or system 100 to be able to predict and/or project (i.e., simulate) the results of particular farm management practices and/or metrics including, but not limited to, how much fertilizer, herbicide, pesticide, and/or chemical is applied to an agricultural field, the number of acres planted, and/or seeding rate. Thus, by using the method 200 and/or system 100, a user, such as a farmer, could determine what farm management type practices he or she should perform in order to achieve a desired outcome.

Further, output data/results of the simulations can be compared to historical baseline dataset(s) and/or to future baseline dataset(s) to help users better understand the output data and to better be able to make decisions accordingly.

Not only is the disclosed method 200 and/or system 100 useful for a farmer, but a breeder and/or seed company will benefit tremendously by using the method 200 and/or system 100. A breeder and/or seed company can make crop product decisions and/or gene editing decisions for particular crops and/or a particular variety of crop. For example, a breeder can determine how best to engineer crops and/or varieties of crops in order to achieve desired outcomes based on any metric including, but not limited to, environmental metrics (such as greenhouse gas emissions, chemical runoff, water use metrics, and the like), financial metrics (such as profit per acre, revenue per acre, market share, and the like), and/or farming metrics (such as acres harvested, yield, and the like). For instance, if a breeder and/or seed company believes that projected nitrogen runoff will be too high in future years, said breeder and/or seed company can genetically engineer crops and/or crop varieties to require less nitrogen, which would allow farmers to maintain yields and/or profits while applying less nitrogen leading to less nitrogen runoff.

Due to the nonlinear nature of complex systems, such as the system(s) which are modeled herein using the system 100, method 200, and/or other aspects of the disclosure, unexpected results can occur. Complex systems include a variety of variables and/or factors wherein relationships between such variables and/or factors can greatly influence results of a simulation. Small differences in input data can create massive differences in output data.

When using the system 100, method 200, and/or any other aspects of the present disclosure, a scenario (Scenario A) was created wherein simulation(s) were performed wherein historical input data was compared to future/projected input data that included drought frequency increasing by 7% and a market demand increase of 5% related to soy beans occurring in 2026. The results/output data of this scenario show that higher production of soy beans occurred following the 2026 demand increase until the end of the decade and then returned to its base pattern. The results additionally show that greenhouse gas emissions increased as a result of more land being farmed to meet the higher demand and due to the prices of soy beans being higher. The results of Scenario A further show that the price of soybeans increased dramatically after the 2026 demand increase but with a lag period. Over time the market price returned to more of a status quo as time went on. The results of Scenario A also show that the market price of corn has a longer lag period after the 2026 demand spike for soy beans. However, by 2029 corn prices actually stay higher than soybean prices because more land has been used to produce soybeans which keeps the corn supply lower.

Under another scenario (Scenario B), the system 100, the method 200, and/or another aspect of the present disclosure was used to perform simulation(s) wherein the future baseline input data and/or additional input data includes the same conditions from Scenario A and further includes a soybean product that results in 10% higher yields, a 10% reduction in nitrogen use, and a 5% reduction is water use. The results of Scenario B show that the company that produced the soybean product experiences a rapid increase in market share due to the improved revenue for farmers. The results further show massive production increases for soy beans. Notably, the results show greenhouse gas emission savings regarding soybeans due in large part to per bushel fertilizer efficiency gains and due in smaller part to less land being farmed. However, such greenhouse gas emission savings are not consistent between years but, instead, fluctuate. The results further show that the number of acres planted is lower when prices are low, but acres planted goes up as prices increase because farmers can make more per acre. This explains the fluctuations. The results further show that the demand spike in 2026 is absorbed in 2027/2028, which is quicker than Scenario A. Additionally, the results show that the market price for soybeans in the period following 2027/2028 has much wider oscillations (higher highs and lower lows) than Scenario A. The results further show that Scenario B results in wider oscillations regarding corn prices than in Scenario A. Additionally, the results show that greenhouse gas emissions due to corn are affected in Scenario B, because corn prices and number of acres of corn planted are affected, even though the input data only concerns a soy bean product.

Under another scenario (Scenario C), the system 100, method 200, and/or another aspect of the present disclosure was used to perform simulation(s) wherein the future baseline input data and/or additional input data includes the same conditions from Scenario A and further includes a soybean product that results in 20% higher yields, a 20% reduction in nitrogen use, and a 10% reduction in water use. The results of Scenario C show greenhouse gas emissions related to soybeans are much lower than expected. Also, the results show greater oscillation in soy bean prices as compared to Scenario B.

Under another scenario (Scenario D), the system 100, method 200, and/or another aspect of the present disclosure was used to perform simulation(s) wherein the future baseline input data and/or additional input data includes the same conditions from Scenario A and further includes a soy bean product that results in higher yields but also requires more fertilizer. Scenario D still results in greenhouse gas emission savings regarding soy beans, but not as much savings as Scenario C.

Scenarios A-D highlight the capabilities of the system 100, method 200, and/or any other aspects of the present disclosure. Thus, a seed company/breeder could utilizer the system 100, method 200, and/or any other aspects of the present disclosure to make decisions regarding advancement of crop products based on the results of simulation(s). For example, if a company/breeder utilizes the system 100, method 200, and/or any other aspects of the present disclosure to determine that to begin decreasing greenhouse gas emissions, a soy bean product that increases yields by 15% must not have nitrogen fertilizer needs greater than 2% over the baseline. The research and development and/or product design team of the company/breeder can use this information when developing new crop products. Thus, the system 100, method 200, and/or any other aspects of the present disclosure can help determine the best plant characteristics and/or genetic makeup to achieve nature-positive results without sacrificing production and/or without sacrificing economically and/or financially both from the perspective of the farmers and the consumers.

It is further noted that performing a simulation via the system 100, method 200, and/or any other aspects of the present disclosure can be performed quickly and efficiently. For example, a simulation, which can include a large amount of input data can be performed and results/output data can be provided in a matter of seconds, and in some cases even milliseconds. Most simulations can be performed in less than 5 seconds. Thus, the system 100, method 200, and/or other aspects of the present disclosure can perform the modeling, calculations, and/or simulations much faster than a human trying to do the same by hand.

The system 100 and/or method 200 can include data management capabilities. For example, input data, settings, and/or results/output data from simulations can be saved, stored, archived, and/or tracked for future use such as comparison among different runs. Additionally, artificial intelligence and/or machine learning could utilize the archived data to continually improve the model, system 100, and/or method 200. Archived data can also be deleted either manually by a user and/or automatically by the system 100 and/or method 200. The system 100 and/or method 200 also allows for data (including results/output data from simulations) to be exported. As noted herein, data can also be imported into and/or obtained by the system 100 and/or method 200.

While the method steps of the method 200 of FIG. 2 are shown in a particular order, the method steps could be performed in any order. Additionally, the method 200 could be performed with more steps and/or fewer steps than are shown in FIG. 2.

The system 100 can be used to perform all aspects of the method 200 as shown in FIG. 2 and/or as described herein. In other words, all aspects of the method 200 could be performed via the system 100.

Additionally, the system 100, method 200, and/or any other aspects of the present disclosure can include any features and/or aspects used by and/or included as part of any modeling software and/or platforms created and/or produced by isee systems, inc. ("isee systems"). isee systems provides systems modeling software and/or platforms. isee systems can be found online at https://www.iseesystems.com/.

Figures 3C, 3D:
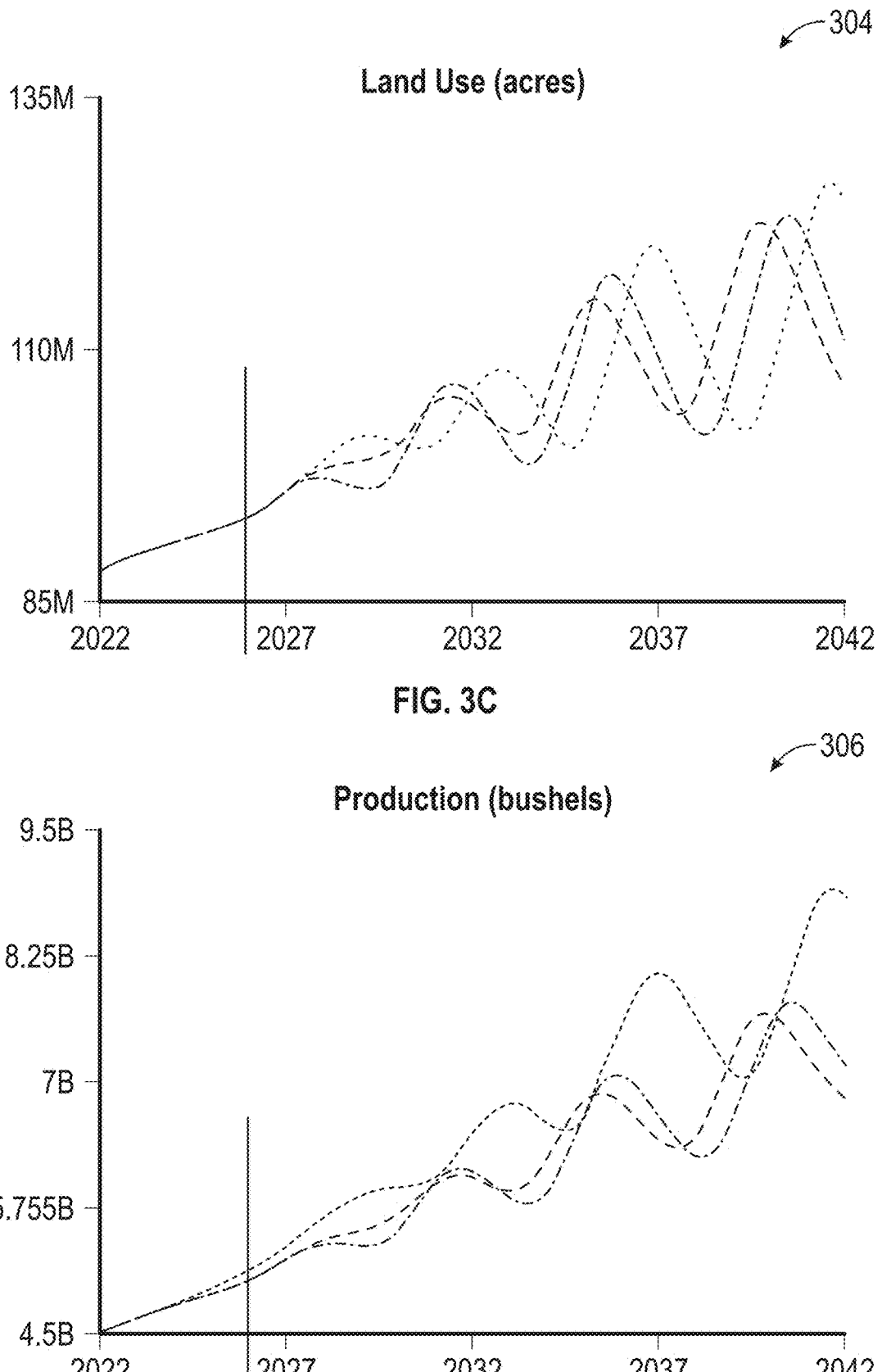
FIG. 3C shows a depiction of a graph related to land use data that can be interpreted using the legend of FIG. 3A.
FIG. 3D shows a depiction of a graph related to production data that can be interpreted using the legend of FIG. 3A.

FIGS. 3A-3D illustrate the effect that different conditions, including market, climate, and/or farm management conditions can have on outcomes such as greenhouse gas emissions, land use, and production. It should be appreciated that FIGS. 3A-3D provide examples of the present disclosure and are not to be limiting on the functionality or other aspects of the disclosure. FIGS. 3A-3D show partial output data and/or partial results of simulations run using the method 200 and/or the system 100 under three different scenarios. FIG. 3A shows a legend 300 used to interpret graphs appearing in FIGS. 3B-3D. The legend 300 includes three scenarios: "Scenario 1" wherein historic conditions continue, "Scenario 2" wherein a 6% one-time increase in soybean market demand occurs in 2026, and "Scenario 3" wherein the 6% demand increase occurs and rapid adoption of a 15% higher-yielding soybean plant with no additional fertilizer need enters the market in 2025. The legend also includes an indicator line where the 6% market demand increase occurs for soy beans in 2026. Note that these are merely illustrative of the capabilities of the system, including the ability to change inputs and obtain different simulation outputs, and are not to be considered limiting on the disclosure.

FIG. 3B shows a graph 302 illustrating greenhouse gas emissions caused by soy bean farming based on the three scenarios of the legend 300. FIG. 3C shows a graph 304 illustrating land use related to soybean farming based on the three scenarios of the legend 300. FIG. 3D shows a graph 306 illustrating soy bean production based on the three scenarios of the legend 300.

As can be seen in the three graphs 302, 304, and 306, in Scenario 1, historic trends continuing leads to overall production increases as well as increases in greenhouse gas emissions and land use. Fluctuations in Scenario 1 are due to supply and demand issues in the commodity market. In Scenario 2, higher prices due to the increase in demand incentivizes planting soybeans which results in higher production and higher land use. Consequently. Scenario 2 also results in an increase in greenhouse gas emissions as tractors drive across more acres, more fertilizers with carbon intensive supply chains are applied, and trucks haul more soy beans off farms. In Scenario 3, due to the demand increase and the adoption of a 15% higher yielding soy bean requiring no additional fertilizer and/or other inputs that enters the market in 2025, production increases substantially as the new product is adopted. Additionally, while land use remains similar to Scenario 2 (although still greater than Scenario 2), net greenhouse gas emissions are significantly lower in Scenario 3 than in Scenario 1 or 2. Additionally, while the carbon dioxide captured by plants photosynthesizing is not reflected in the greenhouse gas emission graph 302, it should be noted that higher biomass soybeans will sequester more carbon dioxide.

Thus, it can be seen via the output data and/or results of FIGS. 3B-3D Scenario 3 results in the most favorable impact in terms of greenhouse gas emissions and production while land use is not drastically higher than in Scenario 2. Thus, if breeders and/or seed companies find Scenario 3 desirable, breeders and/or seed companies can engage in gene editing to engineer a soybean variety that has the traits of Scenario 3, namely a soy bean variety that has a 15% higher yield while not having any additional need for fertilizer and/or other inputs.

Figure 4A:
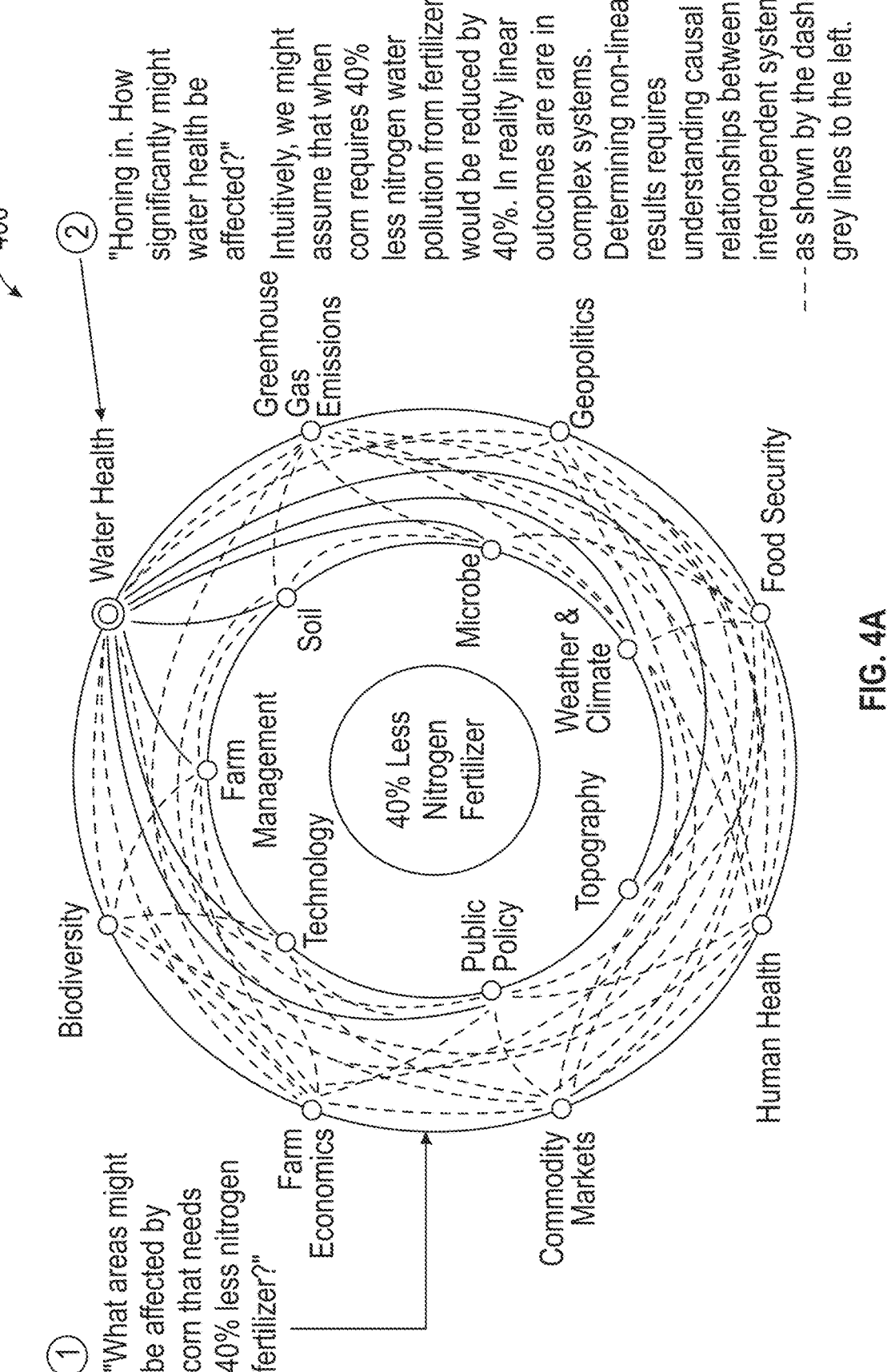
FIG. 4A shows a partial depiction of a graphic used to explain assessment of water pollution in a complex system.
Figure 4B:
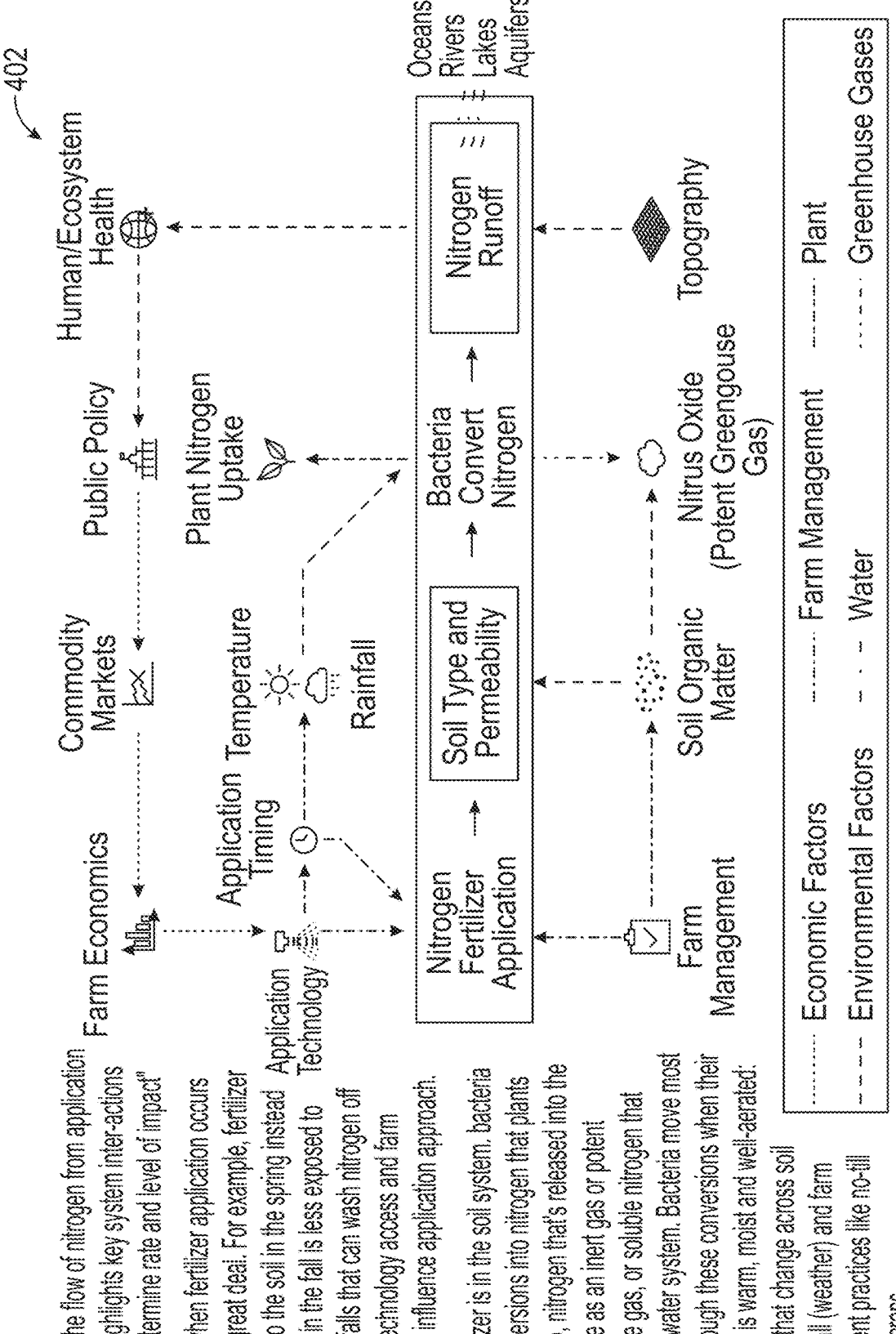
FIG. 4B shows another part of the graphic of FIG. 4A, wherein the graphic of FIG. 4B explains mapping nitrogen flow in a complex system.

FIGS. 4A and 4B show examples of systems analysis and/or partial systems analysis. FIG. 4A shows a web 400 of systems interactions regarding the assessment of water pollution. In order to understand likely impacts, systems analysis often starts with a broad question which opens the door to more complex understanding. When working with complex systems such as the systems involved with the method 200 and/or the system 100, many different industries and/or variables can be affected. For example, a question such as "what areas might be affected by corn that needs 40% less nitrogen fertilizer?", many different areas and/or industries may be affected. For instance, as shown in FIG. 4A, such a question could affect and/or could involve considering biodiversity, water health, greenhouse gas emissions, geopolitics, food security, human health, commodity markets, farm economics, farm management, soil, microbe, weather and climate, topography, public policy, technology, and the like. As shown in FIG. 4A, when dealing with complex systems, relationships between independent systems can have a significant impact on outcomes and/or results of the complex systems. Linear outcomes are rare in complex systems. The lines connecting the different areas and/or industries in the web 400 of FIG. 4A represents all the different connections between independent systems.

FIG. 4B shows a map 402 representing the flow of nitrogen from application onward. The map 402 of FIG. 4B illustrates all the areas, systems, and/or industries involved in mapping nitrogen flow. For instance, the map 402 includes areas, systems, and/or industries such as farm economics, commodity markets, public policy, human/ecosystem health, application technology, application timing, temperature and rainfall, plant nitrogen uptake, farm management, soil organic matter, nitrous oxide (potent greenhouse gas), topography, nitrogen fertilizer application, soil type and permeability, bacteria that converts nitrogen, nitrogen runoff, bodies of water such as oceans, rivers, lakes, aquifers, and the like. As an example, farm management can affect nitrogen flow based on the application of the nitrogen fertilizer. Fertilizer injected into the soil in the spring is less exposed to rainfall than fertilizer sprayed in the fall. Access to technology and farm economics can influence application approach. Once fertilizer is in the soil system, bacteria begin converting the fertilizer into nitrogen that plants can absorb, into nitrogen that is released into the atmosphere as inert gas or potent greenhouse gas, or into soluble nitrogen that enters the water system. Bacteria move most quickly through these conversions when their soil habitat is warm, moist, and well-aerated. These conditions can vary across soil type, weather conditions such as rainfall, and farm management practices such as no-till farming and/or cover crop usage. Thus, it can be seen that when dealing with complex systems, the relationships between many different independent systems can affect outcomes and/or results. Additionally, it is noted that FIGS. 4A and 4B show only a glimpse of the many interactions that ultimately determine aspects of water pollution such as rate and level of the pollution.

The content of and description related to FIGS. 4A and 4B highlight the fact that agricultural, economic, and/or environmental processes are not intuitively linear, but rather are affected over time by a unique series of system interactions. The system 100, method 200, and/or other aspects of the present disclosure can discover emergent trends, powerful levers, and/or variable of change. Thus, users of the system 100, method 200, and/or other aspects of the present disclosure can make decisions that are nature-positive, lead to net-positive outcomes, and/or that improve environmental conditions while also supplying a growing population with ample amounts of food.

Figure 5:
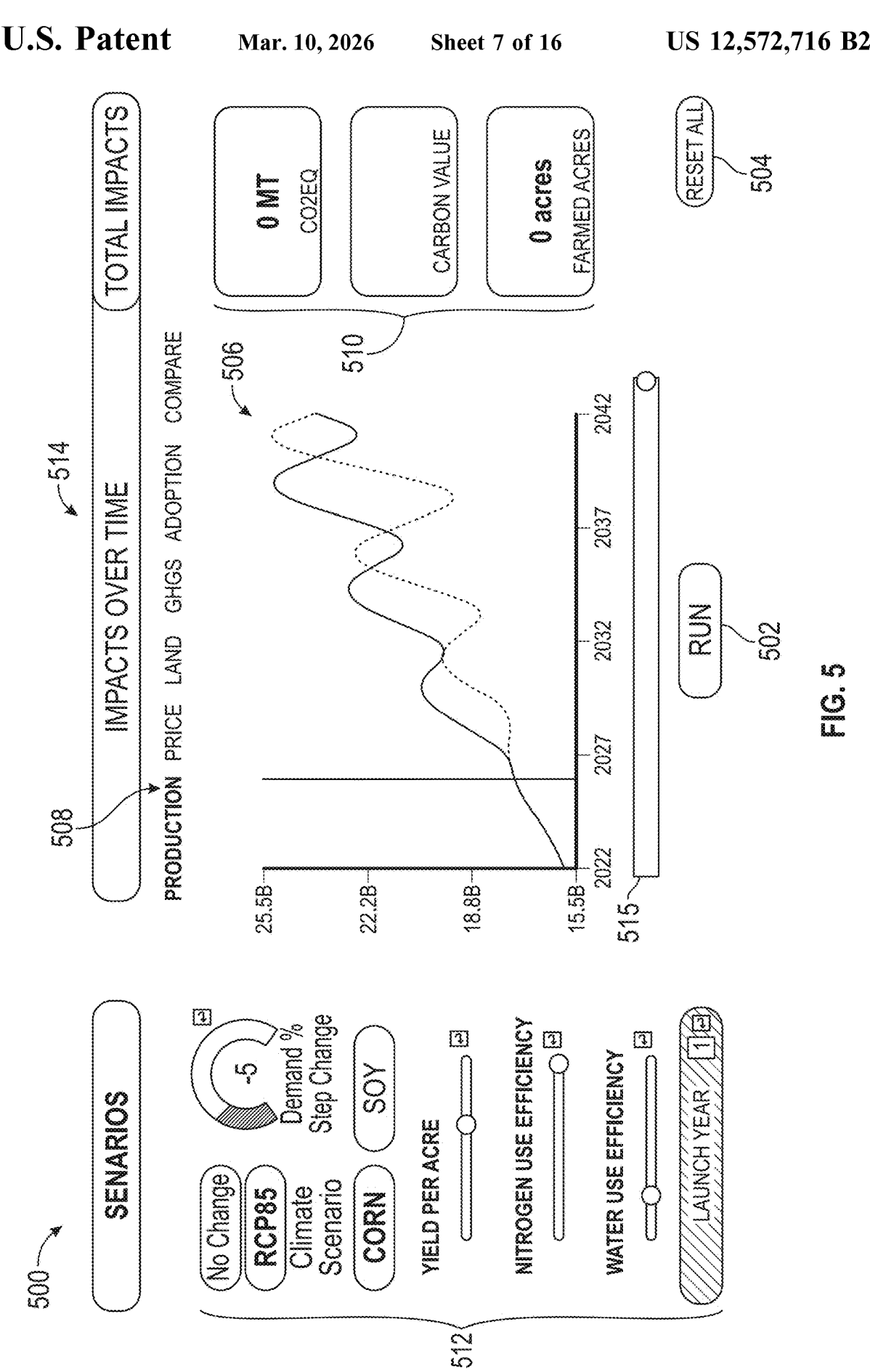
FIG. 5 shows aspects of a human machine interface (HMI) related to performing systems modeling.

FIG. 5 shows a view of an HMI 500. According to some embodiments, the HMI 500 shown in FIG. 5 could be the HMI 112 of the system 100 and/or could be the HMI created/utilized/displayed by the method 200. The HMI 500 can be displayed on and/or accessed via a tablet, phone, computer, laptop, television, any sort of handheld device with a screen, any sort of mounted device with a screen, and/or any sort of suitable smart device.

As shown in FIG. 5, the HMI 500 can include a RUN button 502, a RESET button 504, zero or more output graph(s) 506, an output toggle bar 508, zero or more output value(s) 510, zero or more user input options 512, an output decision bar 514, and/or a simulation slide bar 515.

The RUN button 502 shown in FIG. 5 can be used to perform and/or run a simulation of a modeling framework. A simulation can be any simulation described herein and can use any modeling framework described herein. When a user interacts with the RUN button 502 of the HMI, a simulation can be performed wherein the input data (which can be defined by a user) is used to produce and display output data. Multiple simulations can be run using different input data.

The RESET button 504 (denoted as "RESET ALL" in FIG. 5) of the HMI 500 shown in FIG. 5 can be used to reset all user input, all output data, all assumptions and/or preferences, and/or any other saved or defined data. For example, by interacting with the RESET button 504, a user can revert to a default input data, erase output data, and the like.

The HMI 500 can include one or more output graph(s) 506. The output graph(s) can display a graphical representation of output data. For example. FIG. 5 shows a graph of production data (bushels produced) for corn output by one or more simulations based on user input data. The two different lines shown on the output graph 506 in FIG. 5 represent two different simulations based on two different sets of input data. Thus, the output graph(s) 506 can be used to view and/or compare results/output data of multiple sets of input data. While only two sets of output data are shown in the output graph 506 of FIG. 5, any number of output datasets ranging from zero to N where N is any number greater than zero could be displayed on the one or more output graph(s) 506.

Additionally, the output toggle bar 508 of the HMI 500 can include multiple options in terms of what kind of graph(s) to display. For example, a user can choose between the options of the output toggle bar 508 to view output data such as production data, price data, land use data, greenhouse gas emission data, adoption data, market share data, and/or comparison data (which can compare output data by crop product, such as by comparing corn to soybeans, and/or by entity that produced a particular crop product). When a user chooses a particular output data option from the output data toggle bar 508, the HMI 500 will update to display the user-selected output data in graphical form.

Further, the HMI 500 can include zero or more output value(s) 510. The zero or more output value(s) 510 can display in a textual and/or numerical manner particular output data. For example, as shown in FIG. 5, the output value(s) 510 can include greenhouse gas emission data such as carbon dioxide equivalent data, carbon value data, and/or land use data such as the number of farmed acres. According to some embodiments, the output value(s) 510 can be modified and/or changed by a user such that the user can decide what output data is displayed textually and/or numerically. While only three output values are shown in FIG. 5, the output value(s) 510 could include any output data described herein. The output value(s) 510 can be related to particular product(s) and/or a particular crop as a whole.

The HMI 500 of FIG. 5 also includes zero or more user input option(s) 512. The user input option(s) 512 can include buttons, toggles, sliders, and/or any other input means. The user input option(s) 512 can include buttons and/or toggles related to choosing between utilizing historical baseline data and/or future/projected baseline data when performing simulations. For example, a user can choose "No Change" in terms of climate data to use historical data and/or a user can choose "RCP85" in terms of climate data to use future/projected data. According to some embodiments, such future/projected data can be climate model RCP 8.5 created by the National Oceanic and Atmospheric Administration (NOAA). As part of the input data, users can modify a demand percentage step change to control and/or specify aspects of the market such as market demand for a particular crop and/or product. As part of the input data, a user can choose which crop to analyze via the HMI 500. For example, the HMI 500 allows a user to choose between corn or soy beans. While only corn and soy beans are shown in FIG. 5, any suitable type of crop could be analyzed. The user input option(s) 512 can include input options related to any historical data, future/projected data, and/or additional input data described herein. For example, the user input option(s) 512 of FIG. 5 include options to adjust and/or modify input data related to yield per acre, nitrogen use efficiency, water use efficiency, and launch year. These values can relate to particular product(s) produced by a particular entity.

The HMI 500 can further include an output decision bar 514. The output decision bar 514 allows a user to display output data over time and/or as a total. For example, results/impacts/output data can be shown graphically and/or in any other suitable manner, such as textually and/or numerically, as a total and/or as measured over time with different values for different moments in time.

The HMI 500 can further include a simulation slide bar 515. The simulation slide bar allows a user to view results/output data of a simulation at a particular point in time by sliding the simulation slide bar 515.

Figure 6:
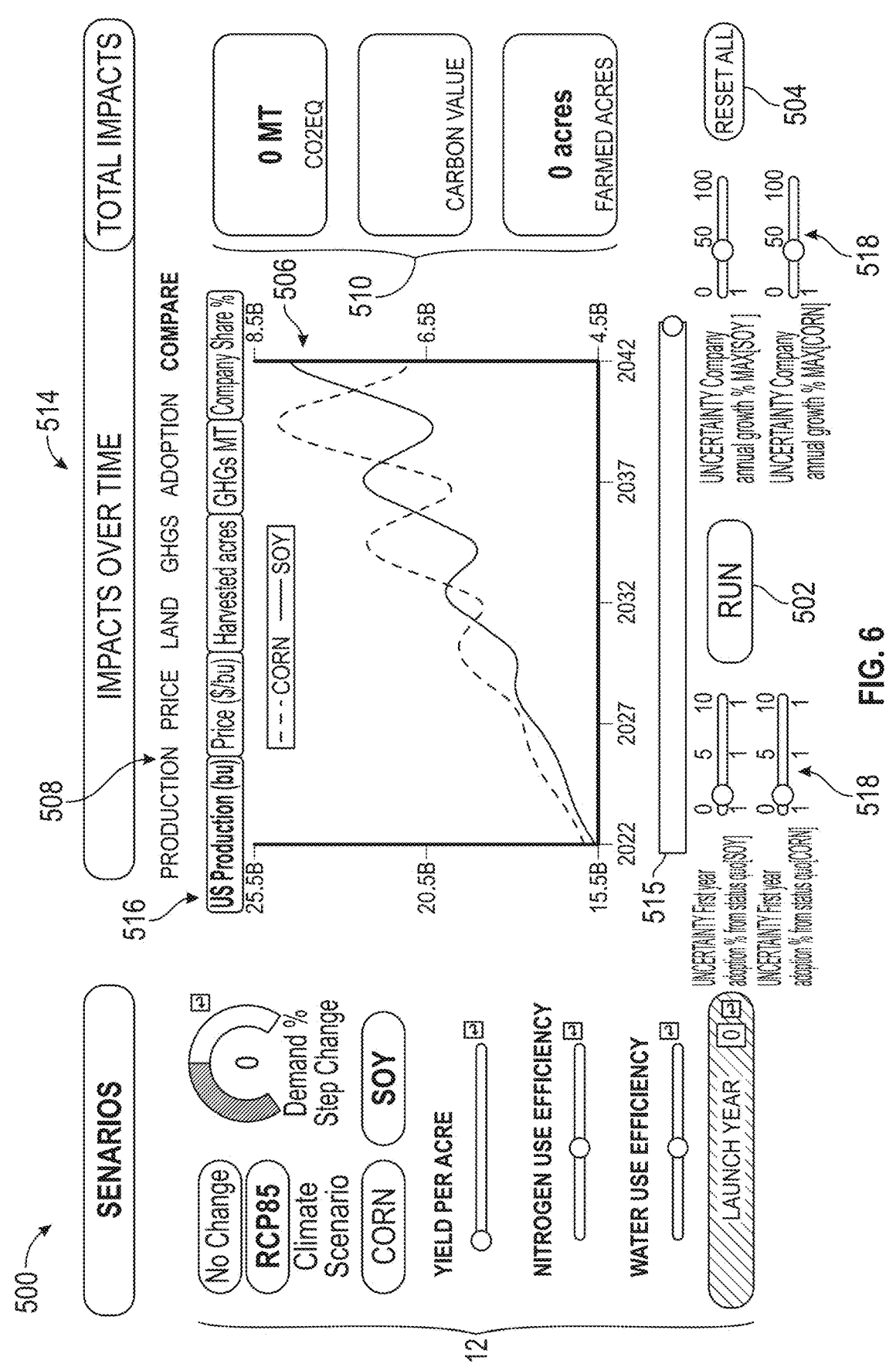
FIG. 6 shows additional aspects of the HMI of FIG. 5.

FIG. 6 shows another view of the HMI 500 wherein a user has selected "Compare" from the output toggle bar 508. This view, as shown in FIG. 6, can display the RUN button 502, RESET button 504, output graph(s) 506, output toggle bar 508, output value(s) 510, user input option(s) 512, output decision bar 514, and simulation slide bar 515 as is displayed in the view shown in FIG. 5. When selecting "Compare" from the output toggle bar 508, a second output toggle bar 516 is displayed wherein a user can compare output data for multiple crops, such as corn and soybeans, and/or products based on different metrics. For example, a user could compare output data for multiple crops and/or products based on production data, price data, land use data such as harvested acres, greenhouse gas emission data, and/or market share data such as market share percentage of a particular company/breeder.

FIG. 6 further includes an additional user input section 518 wherein a user can further specify input data before running a simulation. For example, the additional input section 518 can allow a user to enter first year adoption data for multiple crops (such as corn and/or soy beans) and/or product(s). The additional input section 518 also allows a user to enter annual growth percentage maximum for a particular company/breeder across multiple crops (such as corn and/or soy beans) and/or product(s).

Figure 7:
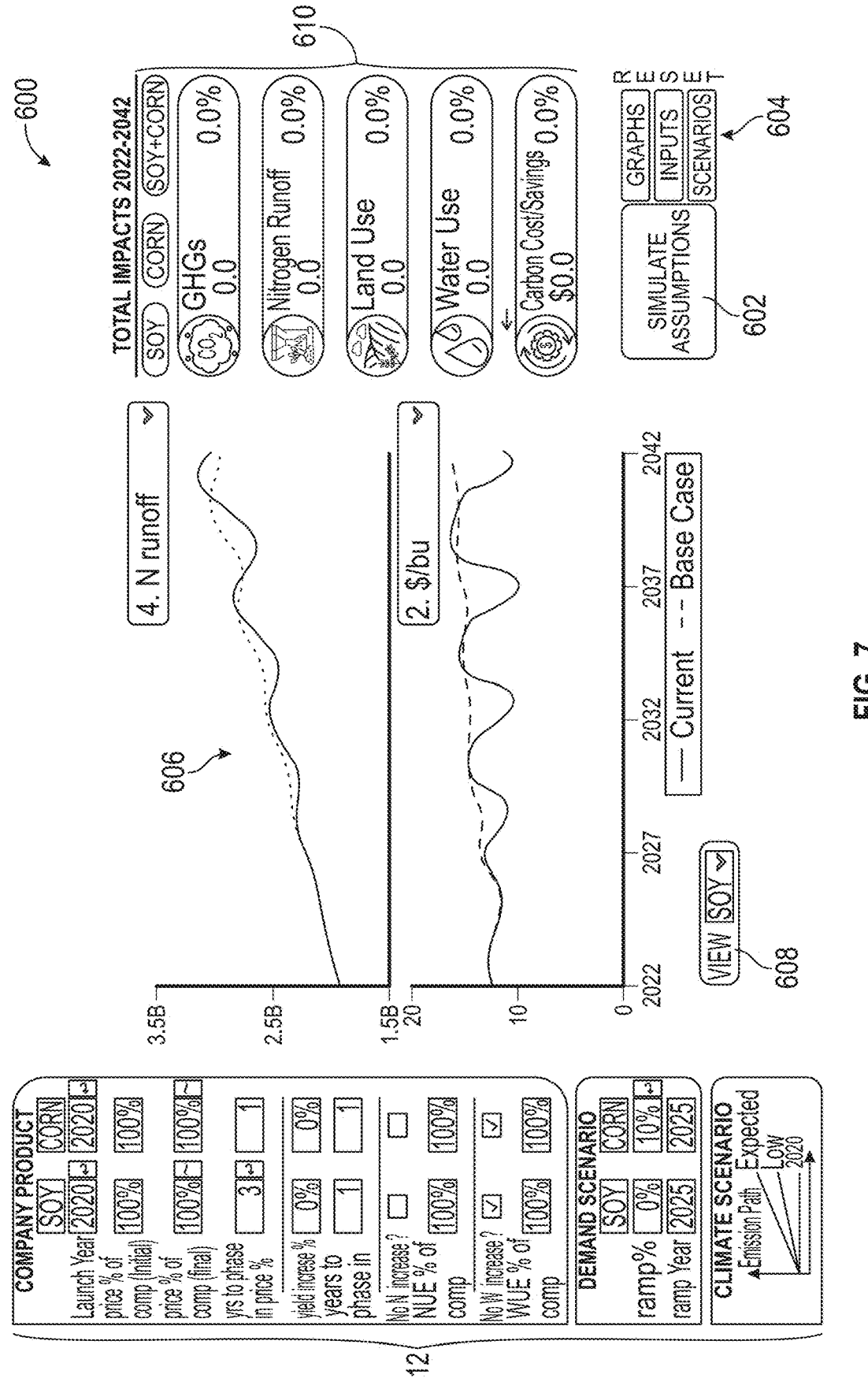
FIG. 7 shows aspects of another HMI related to performing systems modeling.

FIG. 7 shows another HMI 600. According to some embodiments, the HMI 600 shown in FIG. 7 could be the HMI 112 of the system 100 and/or could be the HMI created/utilized/displayed by the method 200. The HMI 600 can be displayed on and/or accessed via a tablet, phone, computer, laptop, television, any sort of handheld device with a screen, any sort of mounted device with a screen, and/or any sort of suitable smart device.

As shown in FIG. 7, the HMI 600 can include a simulation button 602, reset options 604, zero or more output graph(s) 606, a crop toggle 608, zero or more output value(s) 610, and zero or more user input options 612.

The simulation button 602 of the HMI 600 shown in FIG. 7 can be used to perform and/or run a simulation of a modeling framework. A simulation can be any simulation described herein and can use any modeling framework described herein. When a user selects the simulation button 602 of the HMI, a simulation can be performed wherein the input data (which can be defined by a user) is used to produce and display output data. Multiple simulations can be run using different input data.

The reset options 604 of the HMI 600 shown in FIG. 7 can be used to reset all graphs, user input, all output data, all assumptions, all preferences, all scenarios, and/or any other saved or defined data. For example, as shown in FIG. 7, the reset options 604 include three different reset options. A user can choose to reset one or more graphs, a user can choose to reset input data, and/or a user can choose to reset scenarios. By resetting any particular portion of the HMI 600, the HMI 600 can revert to a default version of whatever portion was selected by a user to be reset.

The HMI 600 can include one or more output graph(s) 606. The one or more output graph(s) 606 can display output data in graphical form. While two output graphs 606 are shown in FIG. 7, any number of output graphs ranging from zero to N where N is any number greater than zero could be included. Each output graph 606 can include a dropdown menu that allows a user to choose what output data is displayed via each output graph 606. For example, in FIG. 7, the top output graph 606 is displaying nitrogen runoff data and the bottom output graph is displaying price per bushel data. Other types of data that can be selected via the output graph dropdowns, and thus displayed by one or more of the output graphs 606, include, but are not limited to, production data, land use data (such as acres planted), greenhouse gas emission data, nitrogen runoff data, irrigation data, market data (such as market share percentage by company/breeder), pricing data, cost data (such as revenue less operational expenditure data wherein the revenue less operational expenditure can be measured relative to an initial variety of a particular crop), and/or data related to percentage of acres by crop. Additionally, other types of data that could be selected from the output graph dropdowns could include any output data described herein. Additionally, any data displayed via the output graph(s) 606 can be specific to a particular product, crop, and/or entity. Further, while dropdown menus are used, any sort of suitable means for a user to interact with the HMI 600 could be used.

The HMI 600 further allows a user to run multiple simulations wherein the results/output data of the multiple simulations are viewable together via the zero or more output graph(s) 606. As can be seen in FIG. 7, current output data can be viewed and/or compared relative to a base case via the output graph(s) 606. While only two sets of results/output data are shown on each of the graphs of the output graph(s) 606 of FIG. 7, any number of sets of results/output data could be shown. For example, three, four, or any number of sets of results/output data greater than four could be shown.

The HMI 600 and/or the output graph(s) 606 can include a crop toggle 608. The crop toggle 608 allows a user to toggle between crops when viewing the results/output data via the output graph(s) 606. The results/output data of the simulation(s) can be calculated and/or determined by crop, and, therefore, the results/output data can differ across different crops. For example, via the crop toggle 608, a user can select to view results/output data related to corn. Then, via the crop toggle 608, the user can then choose to view the results/output data related to soybeans. The crop toggle 608 allows a user to select corn, soybeans, and/or any other suitable crop. The output graph(s) 606 can be configured to update based on user input regarding the dropdown menus and/or the crop toggle 608.

The HMI 600 can further include zero or more output value(s) 610 as shown in FIG. 7. In FIG. 7, the output value(s) 610 are shown to include greenhouse gas emission data, nitrogen runoff data, land use data, water use data, and data related to carbon cost/savings. While only these five values are shown in FIG. 7, the output value(s) 610 could include any output data described herein. Additionally, the HMI 600 includes buttons wherein a user can select which crop data to be displayed via the output value(s) 610. For example. FIG. 7 shows that a user can select soybean data, corn data, and/or soy bean and corn data combined. While only corn and soybean data are shown in FIG. 7, additional buttons could be included for additional crops. The output value(s) 610 are configured to update based on user input.

The HMI 600 can further include zero or more user input option(s) 612 as shown in FIG. 7. The user input option(s) 612 can include any historical input data, future/projected input data, and/or additional input data described herein. For example, the user input option(s) 612 can include climate data wherein a user can select to use as input data for a simulation either climate data based on historical greenhouse gas emissions metrics (which could be from a specific year such as 2020), future/projected climate data based on current trajectories for future greenhouse gas emission metrics, and/or another set of future/projected climate data based on more conservative trajectories for future greenhouse gas emission metrics. These three climate conditions can be preset at the time of creation and/or manufacture of the HMI 600. According to some embodiments, a user could manually specify particular climate conditions.

The input option(s) 612 can further include input data related to market conditions. For example, as shown in FIG. 7, a user can select conditions related to market demand conditions. Such conditions can be specified by crop, such as by corn and/or soybeans. These conditions can include ramp year and ramp percentage regarding market demand.

The input option(s) 612 can further include company/breeder specific information. This company/breeder specific information can be specified by crop, such as by corn and/or soy beans, and/or by product. Such company/breeder specific information can include launch year of products, initial price percentage compared to competitor product(s), final price percentage compared to competitor product(s), number of years to phase in price percentage, yield increase percentage, number of years to phase in yield percentage increase, nitrogen use, nitrogen use efficiency percentage compared to competitor product(s), water use, and/or water use efficiency percentage compared to competitor product(s).

At least some input data, as specified by the input option(s) 612, is taken into account when running the simulation(s). Thus, all results and/or output data is determined based on the input option(s) 612. Additionally, a user can specify particular input data, run a simulation, and then change the input data and run a further simulation to compare the results/output data. A user can specify multiple input datasets and run multiple simulations based on those datasets in order to compare the results/output data from multiple datasets.

Figure 8:
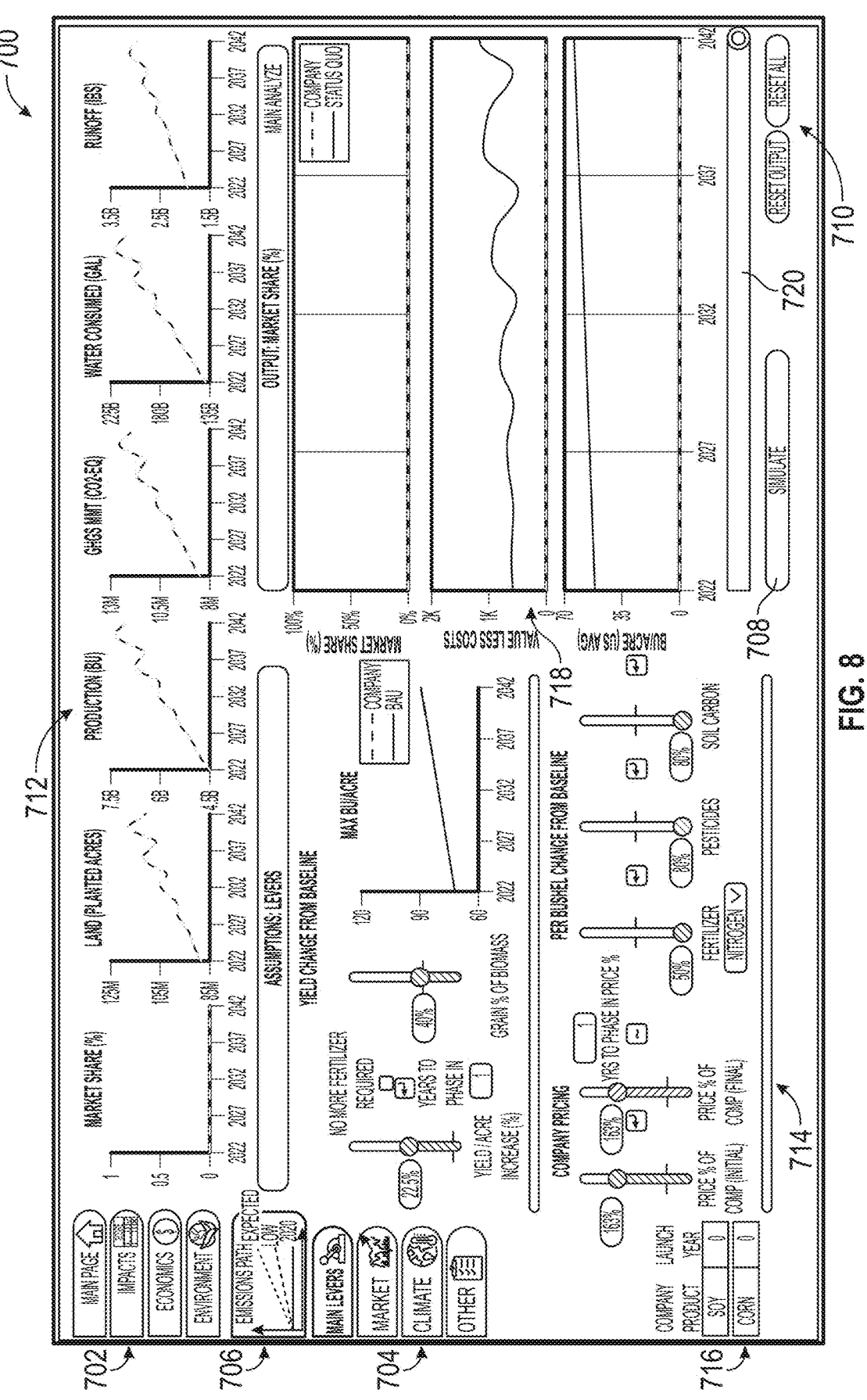
FIG. 8 shows aspects of another HMI related to performing systems modeling.

FIG. 8 shows another HMI 700. According to some embodiments, the HMI 700 shown in FIG. 8 could be the HMI 112 of the system 100 and/or could be the HMI created/utilized/displayed by the method 200. The HMI 700 can be displayed on and/or accessed via a tablet, phone, computer, laptop, television, any sort of handheld device with a screen, any sort of mounted device with a screen, and/or any sort of suitable smart device.

The HMI 700 can include categorical tabs 702 and/or secondary tabs 704 as shown in FIG. 8. A user can toggle between the different categorical tabs 702 to navigate between different views of the HMI 700. As shown in FIG. 8, the categorical tabs 702 can include at least a main page tab, an impacts tab, an economics tab, and an environment tab. Each of the categorical tabs 702 can display different input data options and/or output data of simulation(s).

By navigating to the main page tab, additional secondary tabs 704 are displayed and are available for a user to select. The secondary tabs 704 can include at least a main levers tab, a market tab, a climate tab, and an "other" tab. Each of the secondary tabs 704 can display different input data options and/or different results and/or output data of simulation(s).

FIG. 8 shows an example view of the HMI 700 wherein a user has selected the main page tab from the categorical tabs 702 and the main levers tab from the secondary tabs 704. This view, as shown in FIG. 8, can include a climate data indicator 706. The climate data indicator 706 can indicate what kind of climate input data is used for simulation(s). Such climate data can include climate data based on historical greenhouse gas emissions metrics (which could be from a specific year such as 2010), future/projected climate data based on current trajectories for future greenhouse gas emission metrics, and/or another set of future/projected climate data based on different trajectories for future greenhouse gas emission metrics. These three climate conditions can be preset at the time of creation and/or manufacture of the HMI 700. According to some embodiments, a user could manually specify particular climate conditions.

The example view of the HMI 700 shown in FIG. 8 can further include a simulate button 708. The simulate button 708 can be used to perform and/or run a simulation of a modeling framework. A simulation can be any simulation described herein and can use any modeling framework described herein. When a user selects the simulate button 708 of the HMI 700, a simulation can be performed wherein the input data (which can be defined by a user) is used to produce and display results and/or output data. Multiple simulations can be run using different input data. The results/output data of multiple simulations can then be displayed together and/or compared via the HMI 700.

The example view of the HMI 700 shown in FIG. 8 can further include reset options 710. The reset options 710 can include at least two buttons: a reset output button and a reset all button. The reset output button can be used to erase and/or reset the results and/or output data (such as graphical data, textual data, numerical data, and the like) without resetting any input data. The reset all button can be used to reset all user input, all output data, all assumptions and/or preferences, and/or any other saved, specified, and/or defined data. For example, the reset all button can revert the HMI 700 to default input data, erase output data, and the like.

The example view of the HMI 700 shown in FIG. 8 can further include an output graph ribbon 712. The output graph ribbon 712 can include zero or more output graphs that each display results and/or output data of one or more simulation(s) in graphical form. While six output graphs are shown in the output graph ribbon 712 in FIG. 8, any suitable number of output graphs could be included. The output graphs of the output graph ribbon 712 of FIG. 8 include a market share graph, a land use graph (related to planted acres), a production graph, a greenhouse gas emission graph (related to carbon dioxide equivalents), a water consumption graph, and a runoff graph (related to nitrogen or other chemical(s)). While only these output data types are shown in the output graph ribbon 712, the output graph ribbon could include a graph showing any type of results and/or output data described herein.

The example view of the HMI 700 shown in FIG. 8 can further include main lever input data option(s) 714. The main lever input data option(s) 714 can be any historical data, future/projected data, and/or additional input data described herein. As shown in FIG. 8, the main lever input data option(s) 714 can include input data related to product(s) of a particular company/breeder. For example, as shown in FIG. 8, a user can enter input data related to a particular company's and/or breeder's product(s) such as yield/acre increase percentage above competitor product(s) which can be achieved at launch or phased in over time, the number of years to phase in the yield/acre increase for the product(s), fertilizer information related to the product(s), grain percentage of biomass of the product(s), initial price percentage of the product(s) relative to competitor product(s), final price percentage of the product(s) relative to competitor product(s), number of years to phase in price percentage between initial and final, fertilizer use for the product(s) (wherein fertilizer could include nitrogen, phosphorous, and/or potassium), pesticide use for the product(s), and/or soil carbon inputs for the product(s). The main lever input data option(s) 714 can also include a graphical representation of maximum production information (bushels/acre) of a particular product and/or crop of a particular company compared to a product and/or crop of a competitor.

The example view of the HMI 700 shown in FIG. 8 can further include product and launch year input data 716. This launch year data allows a user to specify which product(s) of a particular company/breeder is being analyzed by the simulation(s). Additionally, the product and launch year data 716 allows a user to input a launch year for a particular product of a particular crop. While corn and soybean options are shown in FIG. 8, any crop could be included.

The example view of the HMI 700 shown in FIG. 8 can further include market share output data 718. The market share output data can be displayed graphically, textually, numerically, and/or in any other suitable manner. The market share output data 718 can include multiple graphs. For example, the market share output data 718 can include a main graph that displays a particular company's and/or breeder's market share percentage specified by crop, such as corn and/or soybean. The market share output data 718 can further include analysis graphs. A user can toggle between the main graph and analysis graphs. The analysis graphs of the market share output data 718 are shown in FIG. 8. While three analysis graphs are shown, any number of graphs showing output data could be included. As shown in FIG. 8, each of the output graphs can show the performance of a particular company/breeder as compared to the status quo. The analysis graphs shown in FIG. 8 include a market share percentage graph, a value less costs graph, and a bushel/acre graph (wherein the status quo can be represented by the United States average). While these three metrics are included as analysis graphs, the analysis graphs could include any output data described herein.

The example view of the HMI 700 shown in FIG. 8 can further include a simulation slide bar 720. The simulation slide bar allows a user to view results/output data of a simulation at a particular point in time by sliding the simulation slide bar 720.

Figure 9:
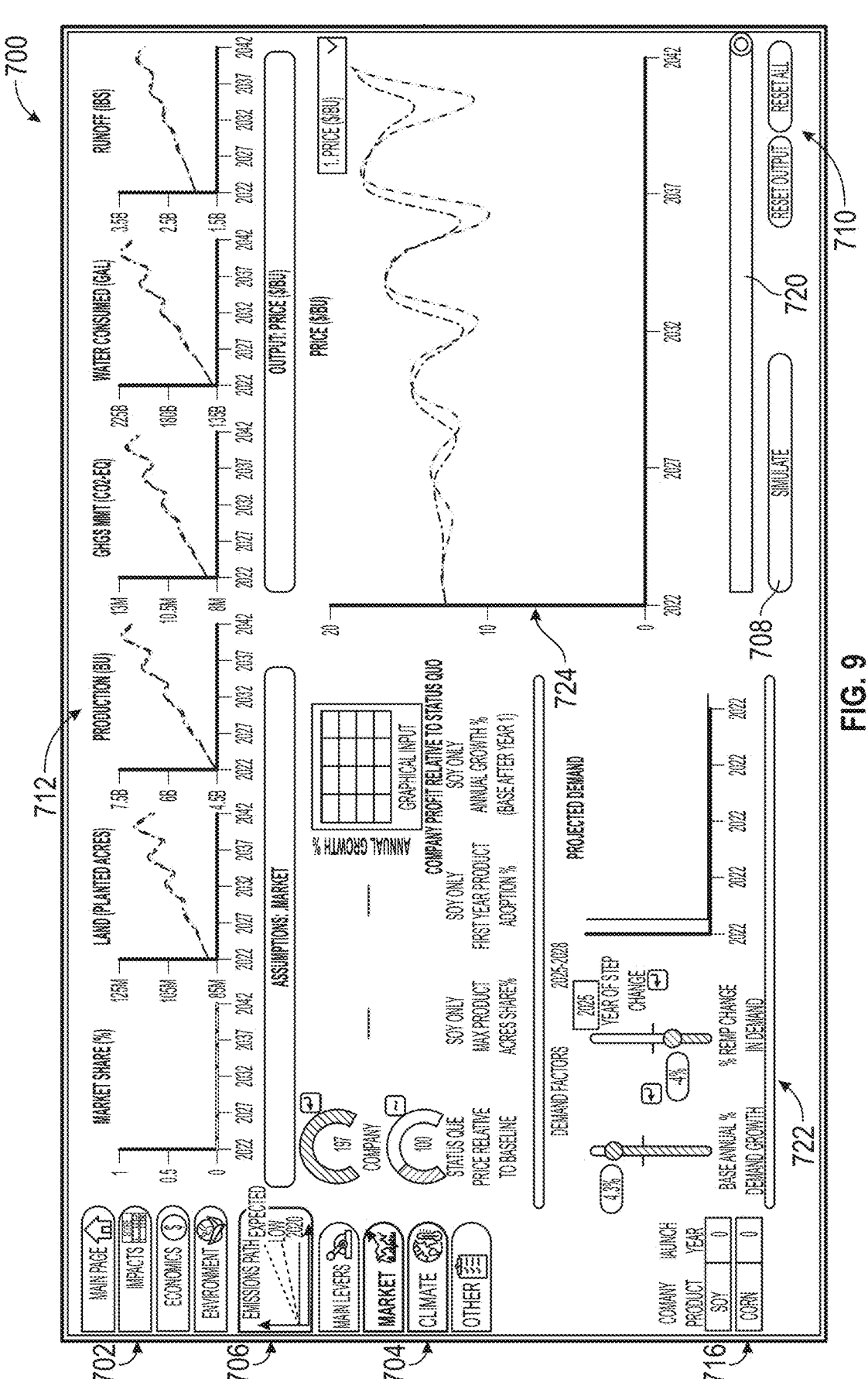
FIG. 9 shows additional aspects of the HMI of FIG. 8.

FIG. 9 shows an example view of the HMI 700 wherein a user has selected the main page tab from the categorical tabs 702 and the market tab from the secondary tabs 704. This view, as shown in FIG. 9, can display the categorical tabs 702, the secondary tabs 704, the climate data indicator 706, the simulate button 708, the reset options 710, the output graph ribbon 712, the product and launch year input data 716, and the simulation slide bar 720.

The example view of the HMI 700 shown in FIG. 9 can further include zero or more market input data option(s) 722. The market input data option(s) 722 can include any historical input data, future/projected input data, and/or additional input data described herein. For example, as shown in FIG. 9, the market input data option(s) 722 can include the ability to set a price multiplier for product(s) specific to a company/breeder and also set a price multiplier for competitor product(s) (denoted as the status quo in FIG. 9) and/or a baseline. The market input data option(s) 722 can further include the ability for a user to set a maximum market adoption percentage for a company/breeder if said company/breeder only produces product(s) for a single crop. The market input data option(s) 722 can further include the ability for a user to set an assumption for the share percentage, per crop, that a company/breeder could ultimately capture. The market input data option(s) 722 can further include the ability for a user to set the first-year adoption percentage for a company's/breeder's product(s) related to a specified crop if said company/breeder only produces product(s) for that crop. The market input data option(s) 722 can further include the ability for a user to enter first year product adoption percentage by crop and/or regardless of crop type. The market input data option(s) 722 can further include the ability for a user to enter an annual growth percentage value wherein the value represents the company's/breeder's annual growth percentage for product(s) of a specified crop (such as corn or soybeans) after the initial year. A 50% annual growth percentage means that for every two customers, one new customer will be added the following year. The market input data option(s) 722 can further include the ability for a user to enter an annual growth percentage after the initial year regardless of crop type. The market input data option(s) 722 can further include the ability for a user to enter and/or modify a base annual percentage demand growth. This value can be used to simulate scenarios with different demand growth. The market input data option(s) 722 can further include the ability for a user to enter and/or modify a ramp/step change percentage in market demand. This value can be used to set a one-time percentage increase in demand growth. The market input data option(s) 722 can also provide a field for a user to enter a year when the ramp/step change in demand occurs. While a field is used in FIG. 9, any suitable input means could be used. The market input data option(s) 722 can also include a graphical representation of projected/future demand wherein said projected/future demand is shown as a percentage of initial demand. The market input data option(s) 722 can further include a graphical representation showing annual growth percentage of a particular product and/or crop versus the status quo, baseline, and/or a competitor product and/or crop.

The example view of the HMI 700 shown in FIG. 9 can further include market tab output data 724. The market tab output data 724 can be displayed in textual, numerical, graphical, and/or any other suitable form. For example, in FIG. 9 the market tab output data 724 is shown as a graph. The market tab output data 724 can include a dropdown menu wherein a user can specify which results/output data to display. For example, the dropdown menu of the market tab output data 724 shown in FIG. 9 includes, but is not limited to, price data (such as price/bushel), market share percentage data (which can include market share percentage for a specific company/breeder), value less costs data (which can compare a specific company/breeder to the status quo and display a value for the difference between the two), and/or data related to the percentage difference in value less costs for a specific company/breeder across different simulations with different input. Additionally, the dropdown menu of the market tab output data 724 can include any sort of output data described herein. While a dropdown menu is used, any sort of suitable means for a user to interact with the HMI 700 could be used.

Figure 10:
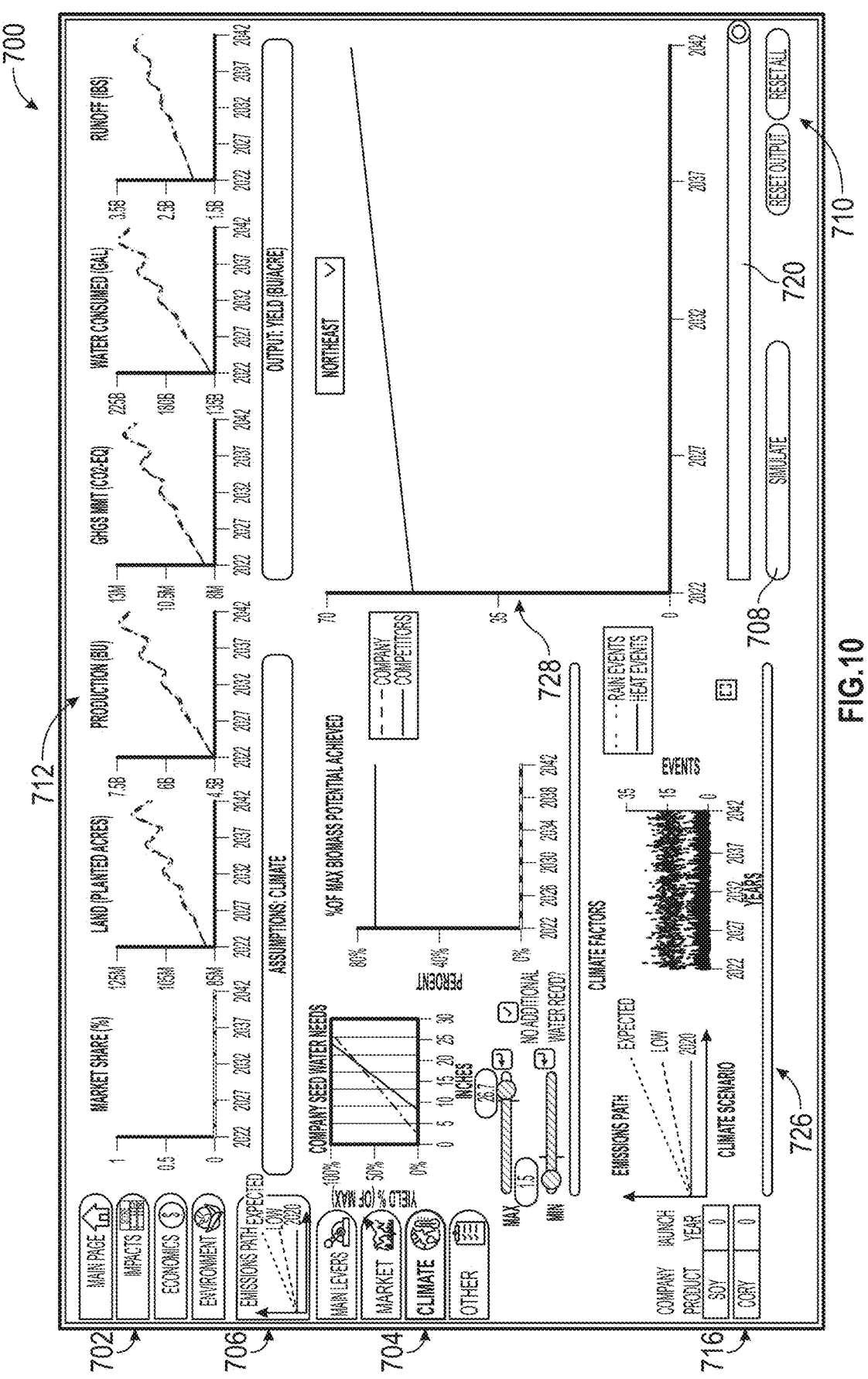
FIG. 10 shows additional aspects of the HMI of FIG. 8.

FIG. 10 shows an example view of the HMI 700 wherein a user has selected the main page tab from the categorical tabs 702 and the climate tab from the secondary tabs 704. This view, as shown in FIG. 10, can display the categorical tabs 702, the secondary tabs 704, the climate data indicator 706, the simulate button 708, the reset options 710, the output graph ribbon 712, the product and launch year input data 716, and the simulation slide bar 720.

The example view of the HMI 700 shown in FIG. 10 can further include zero or more climate input data option(s) 726. The climate input data option(s) 726 can include any historical data, projected/future data, and/or any additional data described herein. For example, as shown in FIG. 10, the climate input data option(s) 726 can include the ability for a user to enter and/or modify a maximum amount of water needed for product(s) of a particular company/breeder, a minimum amount of water needed for a product(s) of a particular company/breeder, additional water amount required, and a graphical representation of yield as a percentage of maximum yield versus water received. Additionally, as shown in FIG. 10, the climate input data option(s) 726 can further include a graphical representation of the percentage of maximum biomass achievable after precipitation by product(s) of a particular company/breeder compared to competitor products over time. The climate input data option(s) 726 can further include a climate scenario selection tool wherein a user can select to use as input data for a simulation either climate data based on historical greenhouse gas emissions metrics (which could be from a specific year such as 2015), future/projected climate data based on current trajectories for future greenhouse gas emission metrics, and/or another set of future/projected climate data based on different trajectories for future greenhouse gas emission metrics. These three climate conditions can be preset at the time of creation and/or manufacture of the HMI 700. According to some embodiments, a user could manually specify particular climate conditions. The climate scenario selected by a user via the climate selection tool is then displayed as the climate data indicator 706. The climate input data option(s) 726 can further include data related to future/projected rain events and/or heat events. This data can be displayed graphically as is the case in FIG. 10 and/or can be displayed in any other suitable format such as textually and/or numerically. The rain event and/or heat event data can be specific to a particular geographical region and/or envirotype such that the rain event and/or heat event data will update based on the region and/or envirotype selected by a user. A user can manually modify the future/projected rain event and/or heat event data.

The example view of the HMI 700 shown in FIG. 10 can further include climate tab output data 728. The climate tab output data 728 can be displayed in textual, numerical, graphical, and/or any other suitable form. For example, in FIG. 10 the climate tab output data 728 is shown as a graph. The climate tab output data 728 can include a graph of yield data (bushels/acre) related to product(s) of a particular company/breeder. The climate tab output data 728 can include a dropdown menu wherein a user can specify yield data by geographical region and/or envirotype. For example, a user can select regions and/or envirotypes from across the United States and/or internationally. When a user selects a region and/or envirotype, the graph of the climate tab output data 728 is configured to update to display the data related to that region. While a dropdown menu is used, any sort of suitable means for a user to interact with the HMI 700 could be used.

Figure 11:
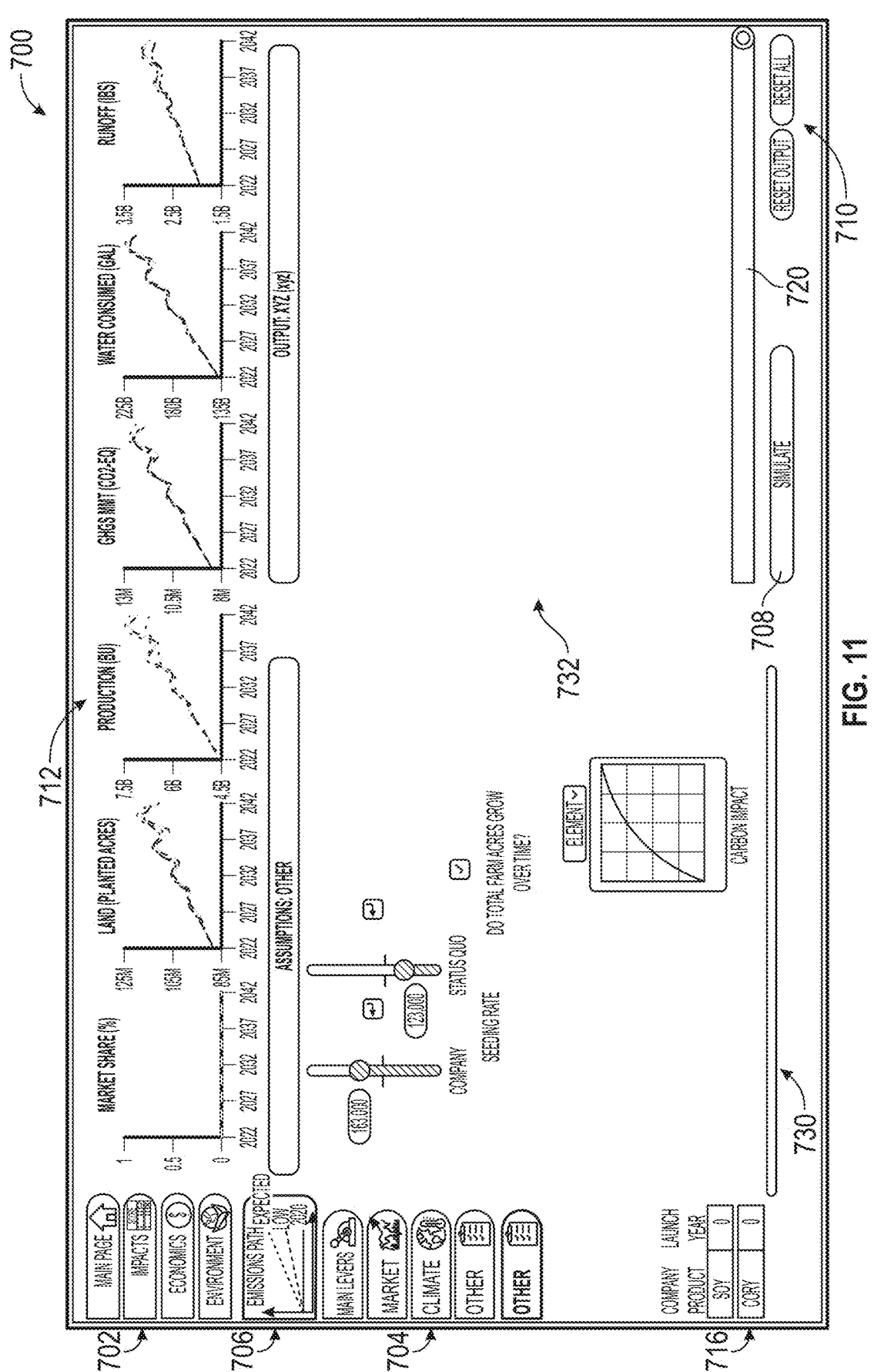
FIG. 11 shows additional aspects of the HMI of FIG. 8.

FIG. 11 shows an example view of the HMI 700 wherein a user has selected the main page tab from the categorical tabs 702 and the "other" tab from the secondary tabs 704. This view, as shown in FIG. 11, can display the categorical tabs 702, the secondary tabs 704, the climate data indicator 706, the simulate button 708, the reset options 710, the output graph ribbon 712, the product and launch year input data 716, and the simulation slide bar 720.

The example view of the HMI 700 shown in FIG. 11 can further include "other" tab input option(s) 730. The "other" tab input data option(s) 730 can include any historical data, projected/future data, and/or any additional data described herein. For example, as shown in FIG. 11, the "other" tab input data option(s) 730 can include the ability for a user to enter, modify, and/or specify recommended seeding rate for product(s) of a particular company/breeder versus the status quo. The other tab input data option(s) 730 can further include the ability for a user to enter and/or select whether total farm acres grow and/or increase over time. The other tab input data option(s) 730 can further include the ability for a user to enter and/or specify carbon impact of various elements and/or products of a particular company/breeder and/or competitor product(s). Such carbon impact data can be viewed graphically by interacting with the carbon impact icon.

The example view of the HMI 700 shown in FIG. 11 can further include "other" tab output data 732. The "other" tab output data 732 can be output data resulting from running simulation(s). While no output data is shown in FIG. 11, the "other" tab output data 732 can be any results/output data that is described herein such as production data, market share data, land use data, and the like. The "other" tab output data 732 can be displayed textually, numerically, graphically, and/or in any other suitable manner.

Figure 12:
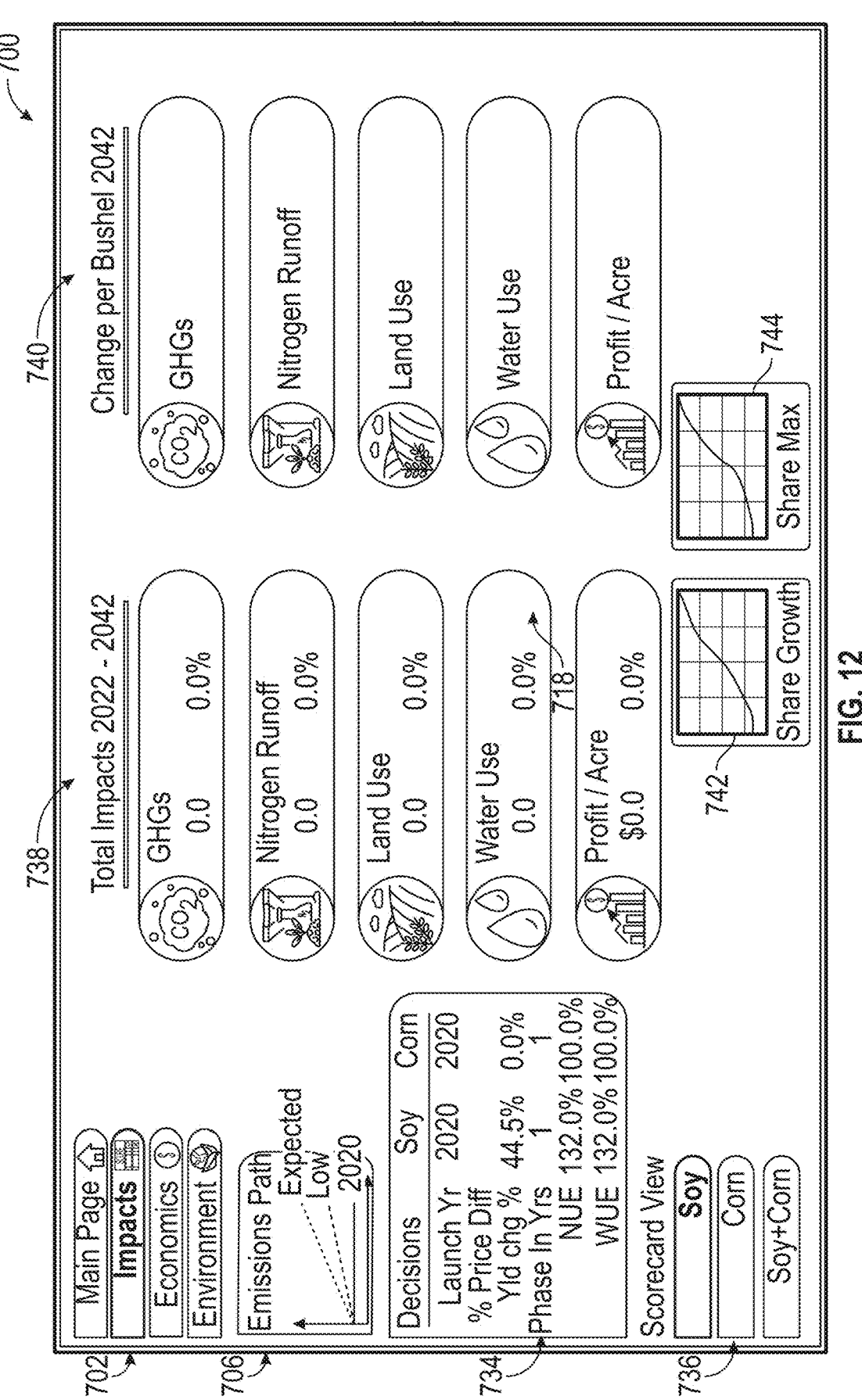
FIG. 12 shows additional aspects of the HMI of FIG. 8.

FIG. 12 shows an example view of the HMI 700 wherein a user has selected the impacts tab from the categorical tabs 702. This view, as shown in FIG. 12, can display the categorical tabs 702 and the climate data indicator 706.

The example view of the HMI 700 shown in FIG. 12 can further include input data table 734. The input data table 734 includes input data that was used to run simulation(s) that produced results/impacts/output data that is displayed as total impact output data 738 and/or change per bushel output data 740. The input data table 734 can include any input data described herein including historical data, future/projected data, and/or additional data. For example, as shown in FIG. 12, the input data table 734 can include input data on a product and/or crop basis related to launch year, percentage price difference between specific product(s) of a particular company/breeder and competitor product(s), yield change percentage, number of years to phase in the yield change, nitrogen use efficiency, and water use efficiency.

The example view of the HMI 700 shown in FIG. 12 can further include a crop output toggle 736 wherein a user can select to display impact/outcome/output data by crop. The user could select a single crop, such as corn or soybeans, and/or could select to view impact/outcome/output data as an aggregation of multiple crops.

The example view of the HMI 700 shown in FIG. 12 can further include total impact output data 738 wherein the output data is based on aggregated total impact over an entire time period. For instance, said time period could span the years 2025-2042. The total impact output data 738 of FIG. 12 ranges from 2022-2042. The total impact output data 738 can include any output data described herein. For example, the total impact output data 738 of FIG. 12 includes greenhouse gas emission data, nitrogen runoff data, land use data, water use data, and data related to profit per acre. The total impact output data 738 can be displayed textually, numerically, graphically, and/or in any other suitable manner.

The example view of the HMI 700 shown in FIG. 12 can further include change per bushel output data 740 wherein the output data is based on the change per bushel from the moment when the simulation is run (or another specified start date) to a specified end date such as the year 2050. The change per bushel output data 740 of FIG. 12 reflects the change per bushel with 2042 as the end date. The change per bushel output data 740 can include any output data described herein. For example, the change per bushel output data 740 of FIG. 12 includes greenhouse gas emission data, nitrogen runoff data, land use data, water use data, and data related to profit per acre. The change per bushel output data 740 can be displayed textually, numerically, graphically, and/or in any other suitable manner.

The example view of the HMI 700 shown in FIG. 12 can further include share growth data 742. Share growth data 742 can include output data related to market share growth for a particular company/breeder. While the share growth data 742 can be displayed graphically, it can also be displayed textually, numerically, and/or in any other suitable manner.

The example view of the HMI 700 shown in FIG. 12 can further include share maximum data 744. Share maximum data 744 can include output data related to maximum market share value for a particular company/breeder. While the share maximum data 744 can be displayed graphically, it can also be displayed textually, numerically, and/or in any other suitable manner.

Figure 13:
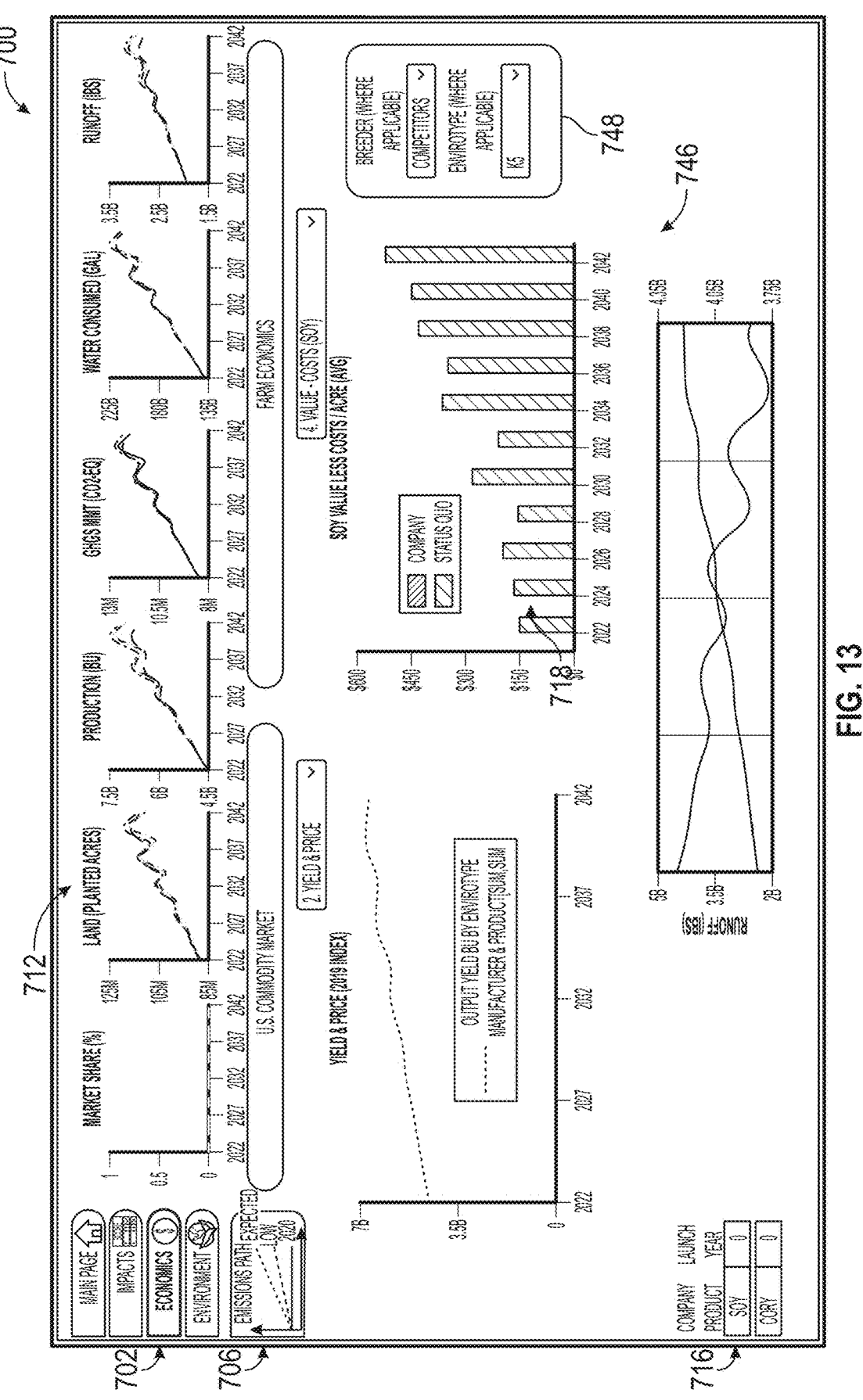
FIG. 13 shows additional aspects of the HMI of FIG. 8.

FIG. 13 shows an example view of the HMI 700 wherein a user has selected the economics tab from the categorical tabs 702. This view, as shown in FIG. 13, can display the categorical tabs 702, the climate data indicator 706, the output graph ribbon 712, and the product and launch year input data 716.

The example view of the HMI 700 shown in FIG. 13 can further include economics output data 746. The economics output data 746 can include output data resulting from running simulation(s). The economics output data 746 can include any output data described herein. While three graphs are shown in FIG. 13, the economics output data 746 can include any suitable number of graphs displaying output data. The economics output data 746 can further include output data in textual form, numerical form, and/or any other suitable form. Additionally, the economics output data 746 can include output data on a macro level such as at the United States commodity market level and/or on a micro level such as at the farm level. For example, as shown in FIG. 13, at least one graph of the economics output data 746 displays data at the U.S. commodity market level. This graph can include a dropdown menu wherein a user can select to view output data such as price data (price per bushel), yield and price data (total sales), land use data (such as planted acres by product and/or crop), and land use data (such as total planted acres). The graph related to United States commodity market is configured to update based on user selection via the dropdown menu such that the selected data is displayed. While a dropdown menu is used, any sort of suitable means for a user to interact with the HMI 700 could be used.

Additionally, the economics output data 746 can include a selection menu 748. The selection menu 748 can include at least two dropdown menus. The first dropdown menu can be used to select a particular company/breeder and/or to select one or more competitors. The second dropdown menu can be used to select a particular region and/or envirotype. The economics output data 746 is configured to update based on the user selection via the selection menu 748 such that the selected data is displayed. While dropdown menus are used, any sort of suitable means for a user to interact with the HMI 700 could be used.

Further, as is shown in FIG. 13, at least one graph of the economics output data 746 displays data at the farm level. This graph can include a dropdown menu wherein a user can select to view output data such as yield trends (as a line graph and/or stacked graph) wherein yields of product(s) of a particular company/breeder can be compared to competitor product(s) and/or to the status quo, total value less costs data wherein value less costs of product(s) of a particular company/breeder can be compared to competitor product(s) and/or to the status quo, value less costs data by crop (such as corn or soybeans) wherein value less costs data of product(s) and/or crop(s) of a particular company/breeder can be compared to competitor product(s), crop(s), and/or to the status quo, revenue per acre data (as a line graph and/or bar graph) wherein revenue of product(s) of a particular company/breeder can be compared to competitor product(s) and/or to the status quo, revenue and cost data by company/ breeder (which includes displaying revenue, total cost, and/ or operational expenditure), total revenue and cost data (which includes displaying revenue, overhead cost, and operational expenditure), and fertilizer costs wherein fertilizer of product(s) of a particular company/breeder can be compared to competitor product(s) and/or to the status quo. While a dropdown menu is used, any sort of suitable means for a user to interact with the HMI 700 could be used.

Furthermore, as is shown in FIG. 13, the economics output data 746 can include at least another graph related to chemical runoff data which can be measured in pounds, metric tons, and/or any other suitable units of measure.

Figure 14:
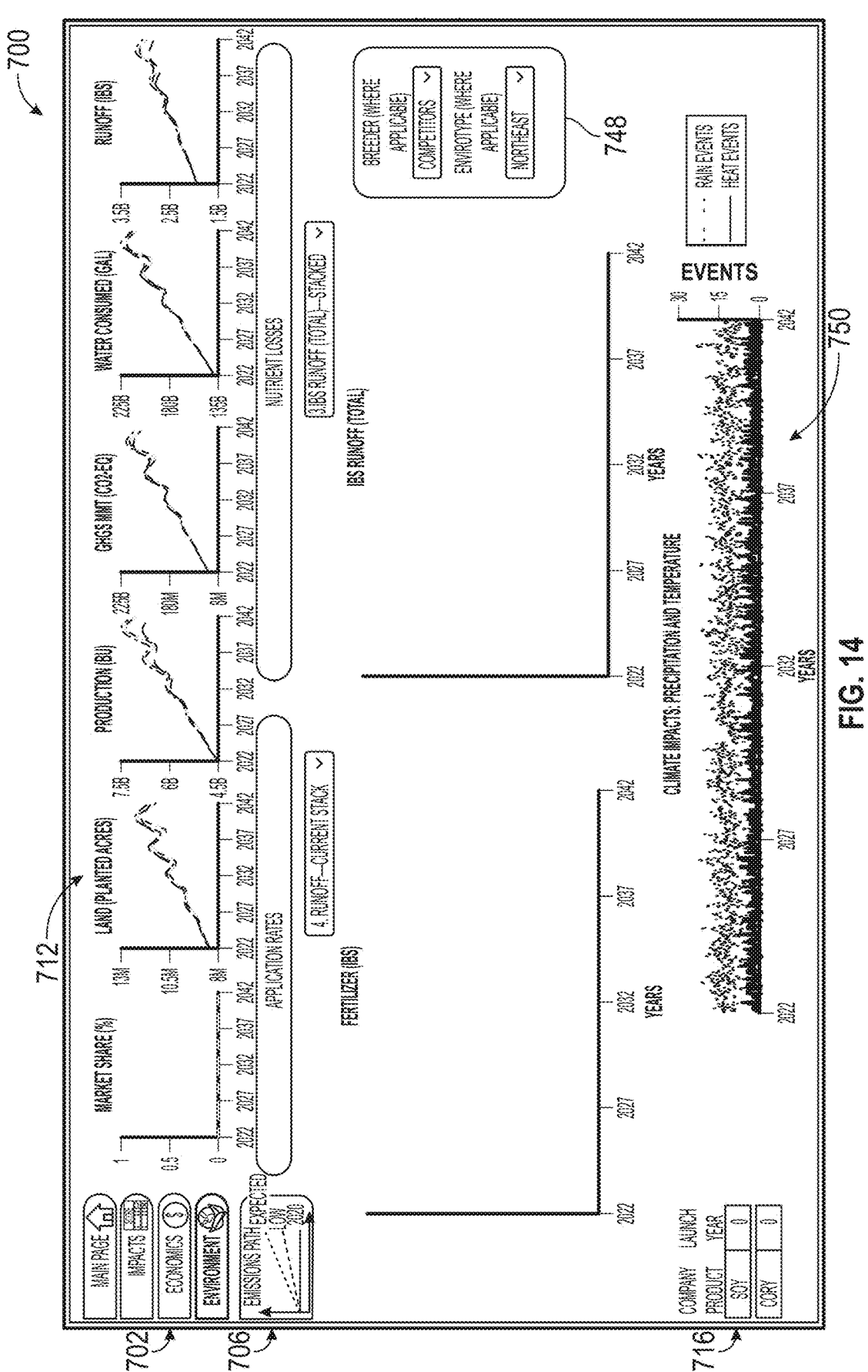
FIG. 14 shows additional aspects of the HMI of FIG. 8.

FIG. 14 shows an example view of the HMI 700 wherein a user has selected the environment tab from the categorical tabs 702. This view, as shown in FIG. 14, can display the categorical tabs 702, the climate data indicator 706, the output graph ribbon 712, and the product and launch year input data 716.

The example view of the HMI 700 shown in FIG. 14 can further include environmental output data 750. The environmental output data 750 can include output data resulting from running simulation(s). The environmental output data 750 can include any output data described herein. While three graphs are shown in FIG. 14, the environmental output data 750 can include any suitable number of graphs displaying output data. The environmental output data 750 can further include output data in textual form, numerical form, and/or any other suitable form.

An example of environmental output data 750 is included in FIG. 14. The environmental output data 750 can include the selection menu 748 from FIG. 13. The selection menu 748 can include at least two dropdown menus. The first dropdown menu can be used to select a particular company/ breeder and/or to select one or more competitors. The second dropdown menu can be used to select a particular region and/or envirotype. The environmental output data 750 is configured to update based on the user selection via the selection menu 748 such that the selected data is displayed. While dropdown menus are used, any sort of suitable means for a user to interact with the HMI 700 could be used.

Additionally, the environmental output data 750 can include output data related to application rates and/or related to nutrient losses. For example, as shown in FIG. 14, at least one graph of the environmental output data 750 displays data regarding application rates. This graph can include a dropdown menu wherein a user can select to view output data such as irrigation trends (as a line graph and/or a stacked graph) wherein irrigation data of product(s) of a particular company/breeder can be compared to competitor product(s) and/or to the status quo. The dropdown menu also includes runoff data (as a line graph and/or a stacked graph) wherein runoff data of product(s) of a particular company/ breeder can be compared to competitor product(s) and/or to the status quo. The graph related to application rates is configured to update based on user selection via the dropdown menu such that the selected data is displayed. While a dropdown menu is used, any sort of suitable means for a user to interact with the HMI 700 could be used.

Further, at least one graph of the environmental output data 750 displays data regarding nutrient losses. This graph can include a dropdown menu wherein a user can select to view output data such as total runoff data (as a line graph and/or as a stacked graph) wherein total runoff data of product(s) of a particular company/breeder can be compared to competitor product(s) and/or to the status quo. This dropdown menu can also include current runoff data (as a line graph and/or as a stacked graph) wherein current runoff data of product(s) of a particular company/breeder can be compared to competitor product(s) and/or to the status quo. This dropdown menu can also include total and/or current greenhouse gas emission data (as a line graph and/or as a stacked graph wherein greenhouse gas emission data of product(s) of a particular company/breeder can be compared to competitor product(s) and/or to the status quo. While a dropdown menu is used, any sort of suitable means for a user to interact with the HMI 700 could be used.

Furthermore, as is shown in FIG. 14, the environmental output data 750 can include at least another graph related to climate metrics which includes, but is not limited to, precipitation, temperature, rain events, and/or heat events.

Each of the HMIs 500, 600, and 700, and any other HMIs described herein, are configured to update based on user input. For example, if a user makes a selection via tabs, dropdown menus, and the like, the HMIs are configured to update accordingly.

Each of the HMIs described herein including the HMI 112, the HMI generated, displayed, and/or provided by the method 200, the HMI 500, the HMI 600, and/or the HMI 700 can include zero or more pop-up windows. The number of pop-up windows can range from zero to N where N is any number greater than zero. The pop-up windows can pop-up, be displayed, and/or otherwise become visible when a user interacts with particular portions of the HMIs. For example, by hovering over and/or by clicking on particular portions of the HMIs, one or more pop-up windows may pop-up, be displayed, and/or otherwise become visible. The pop-up windows can contain information including, but not limited to, explanation and/or instruction regarding how particular portions of the HMIs function, how to interact with particular portions of the HMIs, and/or to explain the meaning of particular portions of the HMIs.

Regarding any description herein wherein an aspect of the disclosure is described to provide the ability for a user to enter, modify, specify, and/or otherwise provide input and/or interact with any HMI described herein, it is noted that the HMI can provide any suitable means for a user to interact with the HMI including, but not limited to, fillable fields, typable fields, levers, sliders, toggles, buttons, radio buttons, switches, tabs, and the like. Further, all aspects of any HMI described herein can be interacted with via any suitable means including, but not limited to, a computer mouse, keyboard, touchscreen, knobs, dials, toggles, levers, sliders, switches, buttons, speakers, microphones, printers, LIDAR, RADAR, and the like.

All aspects of any HMI described herein can be applied to any other HMI described herein. For example, the HMI 112 of the system 100 can include all characteristics and/or features of the HMI generated, displayed, and/or provided by the method 200; the HMI 500; the HMI 600, and/or the HMI 700. Further, as noted herein, all aspects of the system 100 can be performed by the method 200 and all aspects of the method 200 can be provided and/or facilitated by the system 100. Furthermore, the system 100 and/or method 200 can utilize any HMI described herein.

Therefore, as understood from the present disclosure, the apparatus(es), system(s), and/or method(s) described herein can be used to quickly, accurately, efficiently, and cost-effectively provide modeling capabilities for a complex system. The present disclosure allows for accurate modeling of agricultural, environmental, economic, and/or financial outcomes as well as outcomes related to sustainability. The present disclosure allows a user to create an input dataset wherein a user can tailor it to his or her specifications, run simulation(s) based on the input dataset, and be provided with predicted/projected outcomes based on the simulation(s). A user can then plan for the future and/or base decisions and/or actions on the outcomes. Therefore, the present disclosure is useful for a farmer in order to learn the best farm management practices to maximize yield and/or profits while operating in an environmentally friendly manner. The present disclosure is also useful for a seed company/breeder in order to make decisions about what types of crop products to advance and/or how to genetically engineer crop products to maximize profits and/or market share while also contributing to a nature-positive future from an environmental perspective. The present disclosure could further be beneficial for use by scientists, climatologists, economists, public policy makers, politicians, and the like.

What is claimed is:

1. A computer-implemented method that utilizes dynamic systems modeling to predict effects of agricultural scenarios, the method comprising:

storing default data in a computer memory or database;

displaying the default data via a human machine interface;

performing at least one simulation, via a modeling framework trained via machine learning, based on user input, wherein the performing of the at least one simulation comprises:

asking a question involving at least one aspect of the user input;

generating output information, comprising at least company market share percentage associated with a crop type or crop product, relating to plant agriculture based on the at least one simulation;

displaying the output information, via the human machine interface, interactively such that a user can interact with the output information to show a desired view;

providing a digital, slidable bar via the human machine interface; and updating the displayed output information to display, via the human machine interface, the output information at a particular point in time based on the user's manipulation of the bar.

2. The method of claim 1, wherein the output information comprises at least one graph featuring aspects of the at least one simulation, and wherein the at least one graph comprises at least one line graph.

3. The method of claim 1, wherein the output information comprises a plurality of predicted effects, wherein the plurality of predicted effects comprises production data associated with the crop type or crop product, market data associated with the crop type or crop product, and environmental data, further wherein:

(a) the production data associated with the crop type or crop product comprises crop production and/or acres planted;

(b) the market data associated with the crop type or crop product comprises data related to economic metrics at a commodity market level, economic metrics at a farm level, and/or price information;

and (c) the environmental data comprises greenhouse gas emissions, water consumption, chemical runoff, carbon cost and/or savings information, and/or irrigation information.

4. The method of claim 1, wherein the output information comprises at least one graph, chart, and/or numerical value.

5. The method of claim 1, wherein the user input comprises at least data related to market information associated with the crop type or crop product and farm management information associated with the crop type or crop product, wherein the market information associated with the crop type or crop product comprises data regarding market demand and the farm management information associated with the crop type or crop product comprises chemical application data.

6. The method of claim 1, further comprising allowing changes to be made to the user input to create new user input after performing the at least one simulation.

7. The method of claim 6, further comprising performing another simulation based on the new user input via the modeling framework.

8. The method of claim 7, further comprising providing and/or displaying new output information based on the other simulation in conjunction with the output information based on the at least one simulation.

9. The method of claim 1, wherein the default data is based on historical data dating back to at least the year 2000.

10. The method of claim 1, wherein the default data can be adjusted by the user via levers included as part of the human machine interface.

11. The method of claim 1, wherein the modeling framework comprises use of discrete event modeling, agent-based modeling, and/or multi-method modeling.

12. A system that utilizes dynamic systems modeling to predict effects of agricultural scenarios, the system comprising:

a processing unit;

a non-transitory computer-readable medium configured to store executable instructions that, when executed by the processing unit, perform operations, the operations comprising:

storing historical data for use by the system as a historical baseline dataset;

displaying the historical baseline dataset via a human machine interface;

receiving a future baseline dataset created by a user providing modifications to the historical baseline dataset or providing input regarding additional factors not included as part of the historical baseline dataset;

running at least one simulation based on the future baseline dataset via a modeling framework;

generating agricultural prediction output data, comprising at least company market share percentage associated with a crop type or crop product, based on the at least one simulation, wherein the generating of the agricultural prediction output data comprises each layer of a multi-layered artificial neural network of the modeling framework transforming at least one aspect of the future baseline dataset;

displaying the agricultural prediction output data, via the human machine interface, interactively such that a user can interact with the agricultural prediction output data to show a desired view;

providing a digital, slidable bar via the human machine interface;

updating the displayed agricultural prediction output data to display, via the human machine interface, the agricultural prediction output data at a particular point in time based on the user's manipulation of the bar; and prescribing at least one action or farm management practice based on the at least one simulation.

13. The system of claim 12, wherein the human machine interface can be accessed via a computing tool such as a smart device, mobile phone, tablet, and/or computer.

14. The system of any of claim 12, wherein the historical baseline dataset comprises information associated with the crop type or crop product and data related to historical market conditions and/or historical climate conditions.

15. The system of claim 14, wherein the historical market conditions comprise historical data including pricing data, maximum product acres share percentage, first year product adoption percentage, annual growth percentage, base annual percentage demand growth, percentage ramp change in demand, and/or ramp year.

16. The system of claim 14, wherein the historical climate conditions comprise historical data including drought data, water saturation data, rain events, and/or heat events.

17. The system of claim 12, wherein the modifications or the input regarding additional factors comprises at least data related to market information associated with the crop type or crop product, farm management information associated with the crop type or crop product, or climate conditions, further wherein the market information associated with the crop type or crop product comprises pricing data, maximum product acres share percentage, first year product adoption percentage, annual growth percentage, base annual percentage demand growth, percentage ramp change in demand, and/or ramp year.

18. The system of claim 17, wherein the climate conditions comprise data including drought data, water saturation data, rain events, and/or heat events.

19. The system of claim 17, wherein the additional factors comprise factors related to magnitude of crop yield improvement, product launch year, fertilizer consumption, pesticide consumption, soil carbon data, yield per acre, yield per acre increase, maximum bushel per acre data, nitrogen use efficiency, water use efficiency, grain percentage of biomass, pricing information, seeding rate, carbon impact, and/or yield increase percentage.

20. The system of claim 12, wherein the agricultural prediction output data further comprises production data associated with the crop type or crop product, market data associated with the crop type or crop product, and environmental data, and further wherein:

(a) the production data associated with the crop type or crop product comprises crop production and/or acres planted;

(b) the market data associated with the crop type or crop product further comprises data related to economic metrics at a commodity market level, economic metrics at a farm level, and/or price information; and (c) the environmental data comprises greenhouse gas emissions, water consumption, chemical runoff, carbon cost and/or savings information, and/or irrigation information.

21. The system of claim 12, wherein the modeling framework is trained, via machine learning, to understand relationships between variables, further wherein the variables comprise at least the future baseline dataset, further wherein the modeling framework comprises discrete event modeling, agent-based modeling, system dynamics, and/or multi-method modeling.

22. The system of claim 12, further comprising a database wherein the historical data is stored in the database or in the non-transitory computer readable medium.

23. The system of claim 12, wherein the historical data dates back to at least the year 2000.

24. A non-transitory computer-readable medium comprising executable instructions that, when executed, perform operations, the operations comprising:

storing default data in a computer memory or database;

displaying the default data via a human machine interface;

receiving user input, via the human machine interface, to adjust the default data or to provide additional information;

performing at least one simulation based on the user input via a modeling framework;

generating agricultural prediction output information, comprising at least company market share percentage associated with a crop type or crop product, based on the at least one simulation, wherein the generating of the agricultural prediction output information comprises each layer of a multi-layered artificial neural network of the modeling framework transforming at least one aspect of the user input;

displaying the agricultural prediction output information, via the human machine interface, interactively such that a user can interact with the agricultural prediction output information to show a desired view:

providing a digital, slidable bar via the human machine interface;

updating the displayed agricultural prediction output information to display, via the human machine interface, the agricultural prediction output information at a particular point in time based on the user's manipulation of the bar; and prescribing at least one action or farm management practice based on the at least one simulation.

25. The non-transitory computer-readable medium of claim 24, wherein the operations are performed via a processing unit.

26. The non-transitory computer-readable medium of claim 24, wherein the modeling framework comprises discrete event modeling, agent-based modeling, system dynamics, and/or multi-method modeling.

27. The non-transitory computer-readable medium of claim 24, wherein the operations further comprise providing a reset option, via the human machine interface, capable of reverting the user input back to the default data.

28. A system for improved manipulation and visualization of predictive agricultural data over time, the system comprising:

a processing unit;

a memory unit configured to store executable instructions that, when executed by the processing unit, perform operations, the operations comprising:

storing default data in a computer memory or database;   5 displaying the default data via a human machine interface;

providing digital manipulation options, via the human machine interface, of the default data to receive user input;   10 performing at least one simulation, via a machine learning model, based on the user input;

generating output information, comprising at least company market share percentage associated with a crop type or crop product, based on the at least one   15 simulation;

displaying the output information, via the human machine interface, interactively such that the user can interact with the output information to show a desired view;   20 providing a digital, slidable bar via the human machine interface;

updating the displayed output information to display, via the human machine interface, the output information at a particular point in time based on the   25 user's manipulation of the bar;

and updating the displayed output information to display, via the human machine interface, the output information as a total based on the user's manipulation of the bar.   30

* * * * *